(12) United States Patent
Katsumata et al.

(10) Patent No.: US 8,154,068 B2
(45) Date of Patent: Apr. 10, 2012

(54) NON-VOLATILE SEMICONDUCTOR STORAGE DEVICE AND METHOD OF MANUFACTURING THE SAME

(75) Inventors: Ryota Katsumata, Yokohama (JP); Hideaki Aochi, Kawasaki (JP); Masaru Kito, Yokohama (JP); Hiroyasu Tanaka, Tokyo (JP); Megumi Ishiduki, Yokohama (JP); Yosuke Komori, Yokohama (JP); Masaru Kidoh, Komae (JP); Yoshiaki Fukuzumi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 187 days.

(21) Appl. No.: 12/647,836

(22) Filed: Dec. 28, 2009

(65) Prior Publication Data

US 2010/0171162 A1  Jul. 8, 2010

(30) Foreign Application Priority Data

Jan. 7, 2009  (JP) .................. 2009-001420

(51) Int. Cl.
    *H01L 29/76* (2006.01)
(52) U.S. Cl. ....................... 257/314; 438/128
(58) Field of Classification Search .............. 257/314, 257/328, 67; 438/128
    See application file for complete search history.

(56) References Cited

U.S. PATENT DOCUMENTS

| 6,727,544 B2 | 4/2004 | Endoh et al. |
| 6,870,215 B2 | 3/2005 | Endoh et al. |
| 2007/0252201 A1 | 11/2007 | Kito et al. |

FOREIGN PATENT DOCUMENTS

| JP | 2007-266143 | 10/2007 |
| JP | 2007-320215 | 12/2007 |
| WO | WO 2009/075370 A1 | 6/2009 |

OTHER PUBLICATIONS

U.S. Appl. No. 12/679,991, filed Mar. 25, 2010, Fukuzumi et al.

*Primary Examiner* — Ha Tran T Nguyen
*Assistant Examiner* — Shaun Campbell
(74) *Attorney, Agent, or Firm* — Oblon, Spivak, McClelland, Maier & Neustadt, L.L.P.

(57) ABSTRACT

Each of memory strings comprising: a first semiconductor layer having a pair of columnar portions extending in a vertical direction to a substrate and a joining portion formed to join lower ends of the pair of columnar portions; an electric charge accumulation layer formed to surround a side surface of the first semiconductor layer; and a first conductive layer formed to surround a side surface of the electric charge accumulation layer. The columnar portions are aligned at a first pitch in a first direction orthogonal to the vertical direction, and arranged in a staggered pattern at a second pitch in a second direction orthogonal to the vertical and first directions. The first conductive layers are configured to be arranged at the first pitch in the first direction, and extend to curve in a wave-like fashion in the second direction along the staggered-pattern arrangement.

20 Claims, 19 Drawing Sheets

NON-VOLATILE SEMICONDUCTOR STORAGE DEVICE AND METHOD OF MANUFACTURING THE SAME

CROSS-REFERENCE TO RELATED APPLICATIONS

This application is based upon and claims the benefit of priority from the prior Japanese Patent Application No. 2009-1420, filed on Jan. 7, 2009, the entire contents of which are incorporated herein by reference.

BACKGROUND OF THE INVENTION

1. Field of the Invention

The present invention relates to an electrically rewritable non-volatile semiconductor storage device and a method of manufacturing the same.

2. Description of the Related Art

Conventionally, LSIs are formed by integration of devices in a two-dimensional plane on the silicon substrate. Although it is common to reduce (refine) the dimension for each device in order to increase memory storage capacity, recent years are facing challenges in such refinement from the viewpoint of cost and technology. Such refinement requires further improvements in photolithography technology. However, the costs of lithography process are ever increasing. In addition, if such refinement is accomplished, it is assumed that physical improvement limit, such as in breakdown voltage between devices, would be reached unless driving voltage can be scaled. That is, it is likely that difficulties would be encountered in device operation itself.

Therefore, such semiconductor storage devices have been proposed recently where memory cells are arranged in a three-dimensional manner to achieve improved integration of memory devices (see Patent Document 1: Japanese Patent Laid-Open No. 2007-266143).

One of the conventional semiconductor storage devices where memory cells are arranged in a three-dimensional manner uses transistors with a cylinder-type structure (see Patent Document 1). Those semiconductor storage devices using transistors with the cylinder-type structure are provided with multiple conductive layers corresponding to gate electrodes and pillar-like columnar semiconductors. Each columnar semiconductor serves as a channel (body) part of a respective transistor. Memory gate insulation layers are provided around the columnar semiconductors. Such a configuration including these conductive layers, columnar semiconductor layers, and memory gate insulation layers is referred to as a "memory string". In this memory string, the columnar semiconductor layers are formed in a matrix form in the row and column directions parallel to the substrate. The conductive layers are formed in a stripe pattern extending in the row direction, and at a certain pitch in the column direction.

In consideration of the lithography resolution limit (F) and the width of conductive layers, at least a distance of 3F in the column direction and 2F in the row direction is required for a distance between the centers of the columnar semiconductor layers. However, there is still a need for non-volatile semiconductor storage devices manufactured with even smaller occupation area than in the conventional technology as mentioned above.

SUMMARY OF THE INVENTION

One aspect of the present invention provides a non-volatile semiconductor storage device comprising a plurality of memory strings each having a plurality of electrically rewritable memory cells connected in series, each of the memory strings comprising: a first semiconductor layer having a pair of columnar portions extending in a vertical direction to a substrate and a joining portion formed to join lower ends of the pair of columnar portions; an electric charge accumulation layer formed to surround a side surface of the first semiconductor layer; and a first conductive layer formed to surround a side surface of the electric charge accumulation layer and functioning as a control electrode of a respective one of the memory cells, the columnar portions being aligned at a first pitch in a first direction orthogonal to the vertical direction, and being arranged in a staggered pattern at a second pitch in a second direction orthogonal to the vertical and first directions, the first conductive layers being configured to be arranged at the first pitch in the first direction, and extend to curve in a wave-like fashion in the second direction along the staggered-pattern arrangement.

Another aspect of the present invention provides a non-volatile semiconductor storage device comprising a plurality of memory strings each having a plurality of electrically rewritable memory cells connected in series, and a selection transistor connected to one end of a respective one of the memory strings and controlling conduction thereof, each of the memory strings comprising: a first semiconductor layer having a pair of columnar portions extending in a vertical direction to a substrate and a joining portion formed to join lower ends of the pair of columnar portions; an electric charge accumulation layer formed to surround a side surface of the first semiconductor layer; and a first conductive layer formed to surround a side surface of the electric charge accumulation layer and functioning as a control electrode of a respective one of the memory cells, the selection transistor comprising: a second semiconductor layer extending in the vertical direction from a top surface of each of the columnar portions; an insulation layer formed to surround a side surface of the second semiconductor layer; and a second conductive layer formed to surround a side surface of the insulation layer and functioning as a control electrode of the selection transistor, the second semiconductor layers being aligned at a first pitch in a first direction orthogonal to the vertical direction, and being arranged in a staggered pattern at a second pitch in a second direction orthogonal to the vertical and first directions, the second conductive layers being configured to be arranged at the first pitch in the first direction, and extend to curve in a wave-like fashion in the second direction along the staggered-pattern arrangement.

Still another aspect of the present invention provides a method of manufacturing a non-volatile semiconductor storage device having a plurality of memory strings each having a plurality of electrically rewritable memory cells connected in series, the method comprising: depositing a plurality of conductive layers sandwiched between insulation layers; forming a hole to penetrate the plurality of conductive layers and the insulation layers in U-shape, as viewed from a direction parallel to a substrate; forming an electric charge accumulation layer on a side surface, facing the hole, of each of the plurality of conductive layers; forming a semiconductor layer to fill up the hole; and forming a trench to penetrate the plurality of conductive layers and the insulation layers, the holes being formed to be aligned at a first pitch in a first direction parallel to the substrate, and arranged in a staggered pattern at a second pitch in a second direction parallel to the substrate and orthogonal to the first direction, the trenches being formed to be positioned at the first pitch in the first direction, and extend to curve in a wave-like fashion in the second direction along the staggered-pattern arrangement.

DETAILED DESCRIPTION OF THE EMBODIMENTS

Embodiments of a non-volatile semiconductor storage device according to the present invention will now be described below with reference to the accompanying drawings.

(Configuration of Non-Volatile Semiconductor Storage Device 100 in an Embodiment)

Figure 1:
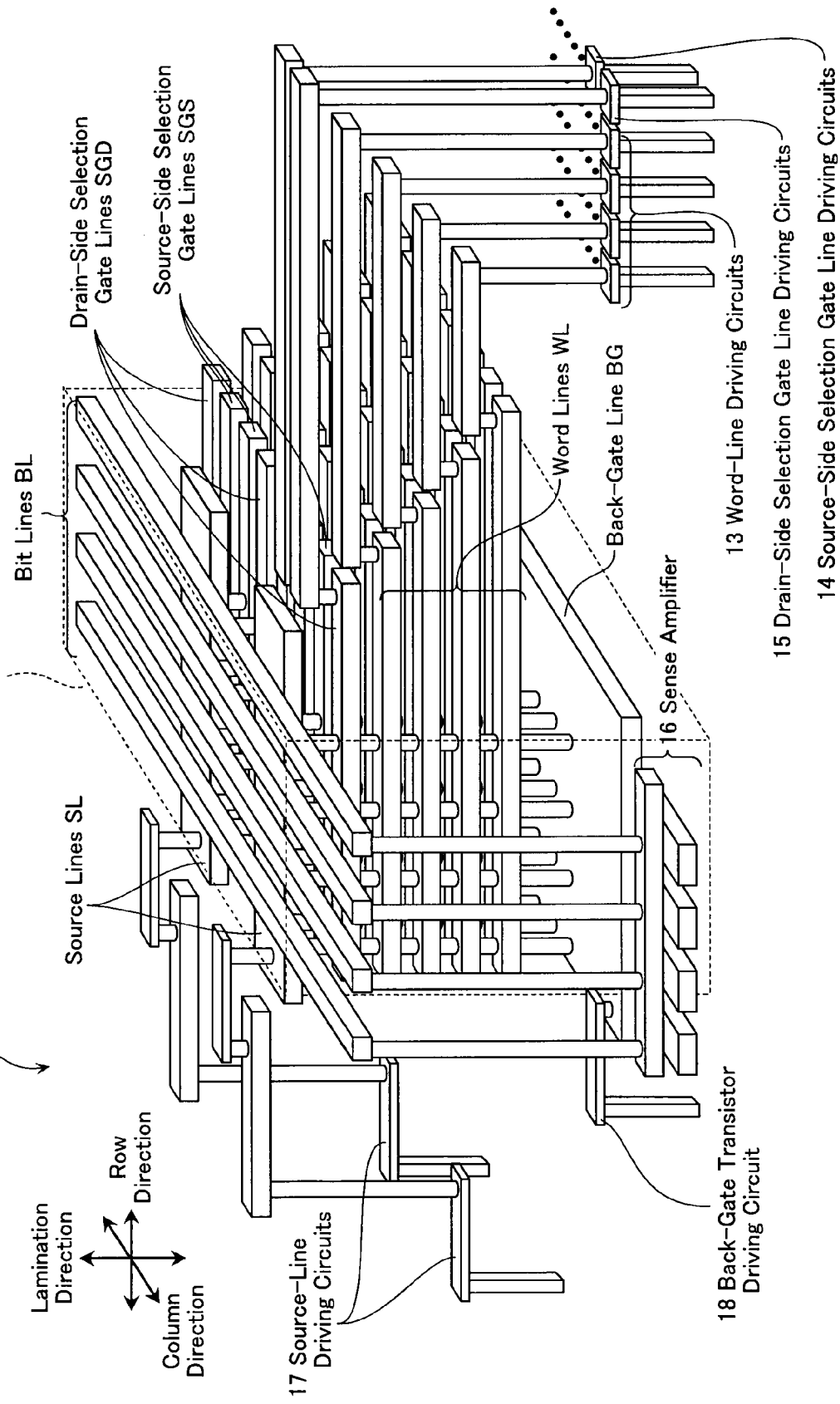
FIG. 1 is a schematic diagram illustrating a configuration of a non-volatile semiconductor storage device 100 according to an embodiment of the present invention.

FIG. 1 schematically illustrates a non-volatile semiconductor storage device 100 according to an embodiment of the present invention. As illustrated in FIG. 1, the non-volatile semiconductor storage device 100 according to the embodiment mainly comprises: a memory transistor area 12; word-line driving circuits 13; source-side selection gate line (SGS) driving circuits 14; drain-side selection gate line (SGD) driving circuits 15; a sense amplifier 16; source-line driving circuits 17; and a back-gate-transistor driving circuit 18. The memory transistor area 12 has memory transistors for storing data. The word-line driving circuits 13 control voltage applied to word lines WL. The source-side selection gate line (SGS) driving circuits 14 control voltage applied to source-side selection gate lines SGS.

The drain-side selection gate line (SGD) driving circuits 15 control voltage applied to drain-side selection gate lines SGD. The sense amplifier 16 amplifies a potential read from a memory transistor. The source-line driving circuits 17 control voltage applied to source lines SL. The back-gate-transistor driving circuit 18 controls voltage applied to a back-gate line BG. In addition to this, the non-volatile semiconductor storage device 100 according to the embodiment comprises bit-line driving circuits that control voltage applied to bit lines BL (not illustrated).

Figure 2:
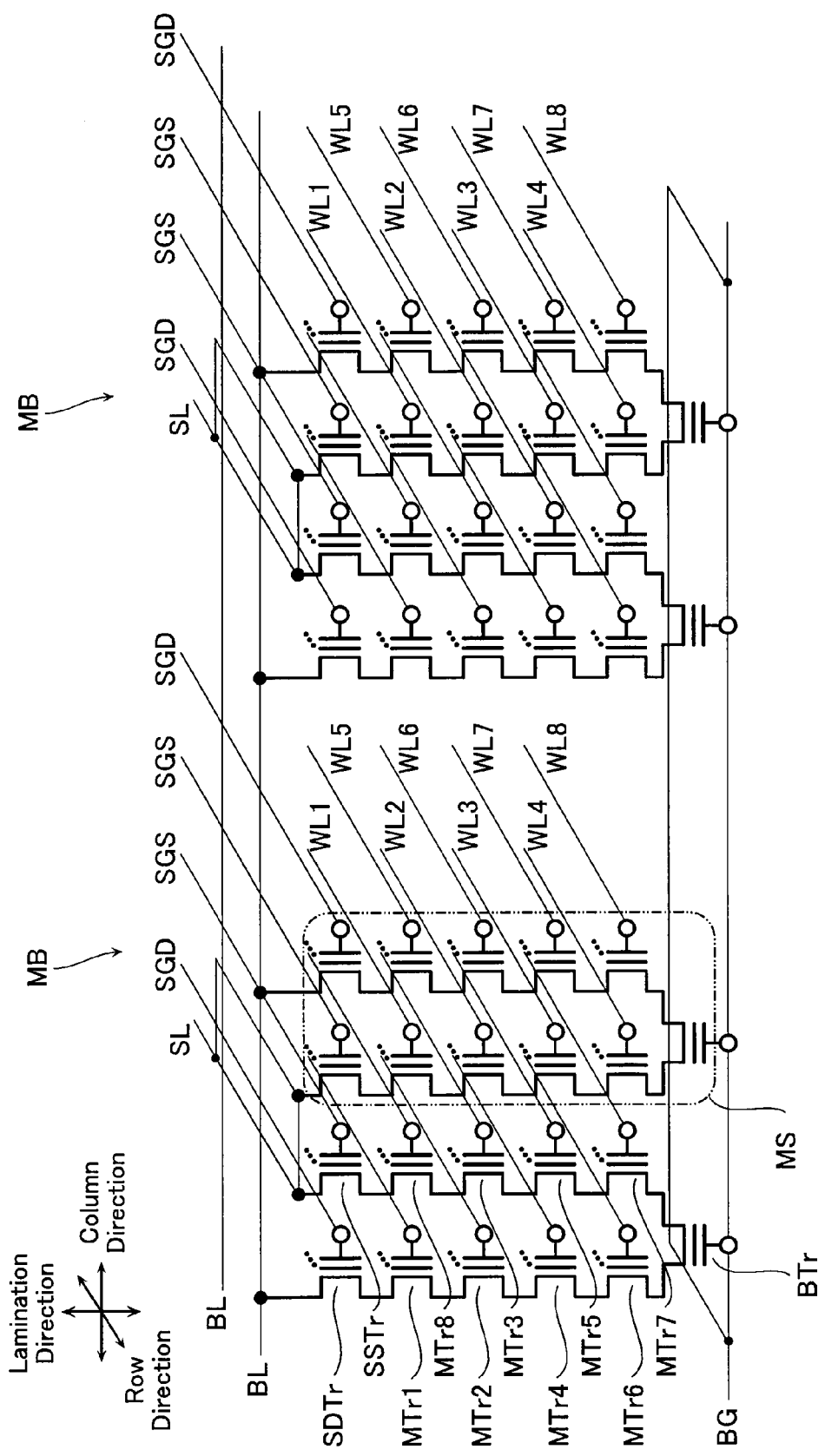
FIG. 2 is a circuit diagram of a part of the non-volatile semiconductor storage device according to the embodiment.

Referring now to FIG. 2, a circuit configuration of the memory transistor area 12 will be described below. FIG. 2 is a circuit diagram of the memory transistor area 12.

As illustrated in FIG. 2, the memory transistor area 12 includes a plurality of memory blocks MB. Each memory block MB comprises a plurality of memory strings MS, source-side selection transistors SSTr, and drain-side selection transistors SDTr. Each memory string MS includes memory transistors MTr1 to MTr8 connected in series and a back-gate transistor BTr. The memory transistors MTr1 to MTr8, which include a MONOS structure, cause electric charges to be accumulated in respective electric charge accumulation layers for storing information. Each back-gate transistor BTr is connected between a memory transistor MTr4 and a memory transistor MTr5. Each drain-side selection transistor SDTr is connected to one end (a memory transistor MTr1) of a respective memory string MS. Each source-side selection transistor SSTr is connected to the other end (a memory transistor MTr8) of a respective memory string MS.

As illustrated in FIG. 2, in each memory block MB, the control gates of the memory transistors MTr1 aligned in the row direction are commonly connected to a word line WL1 extending in the row direction. Similarly, the control gates of the memory transistors MTr2 to MTr8 aligned in the row direction are commonly connected to word lines WL2 to WL8 extending in the row direction. In addition, the control gates of back-gate transistors BTr that are arranged in a matrix form in the row and column directions are commonly connected to a back-gate line BG.

As illustrated in FIG. 2, in each memory block MB, the control gates of the drain-side selection transistors SDTr aligned in the row direction are commonly connected to a drain-side selection gate line SGD. Each drain-side selection gate line SGD is formed to extend in the row direction across a plurality of memory blocks MB. In addition, the other ends of the drain-side selection transistors SDTr aligned in the column direction are commonly connected to a bit line BL. Each bit line BL is formed to extend in the column direction across a plurality of memory blocks MB.

As illustrated in FIG. 2, in each memory block MB, the control gates of the source-side selection transistors SSTr aligned in the row direction are commonly connected to a source-side selection gate line SGS. Each source-side selection gate line SGS is formed to extend in the row direction across a plurality of memory blocks MB. In addition, the other ends of the source-side selection transistors SSTr arranged in the column direction are commonly connected to a source line SL. Each source line SL is formed to extend in the row direction across a plurality of memory blocks MB.

Figure 3:
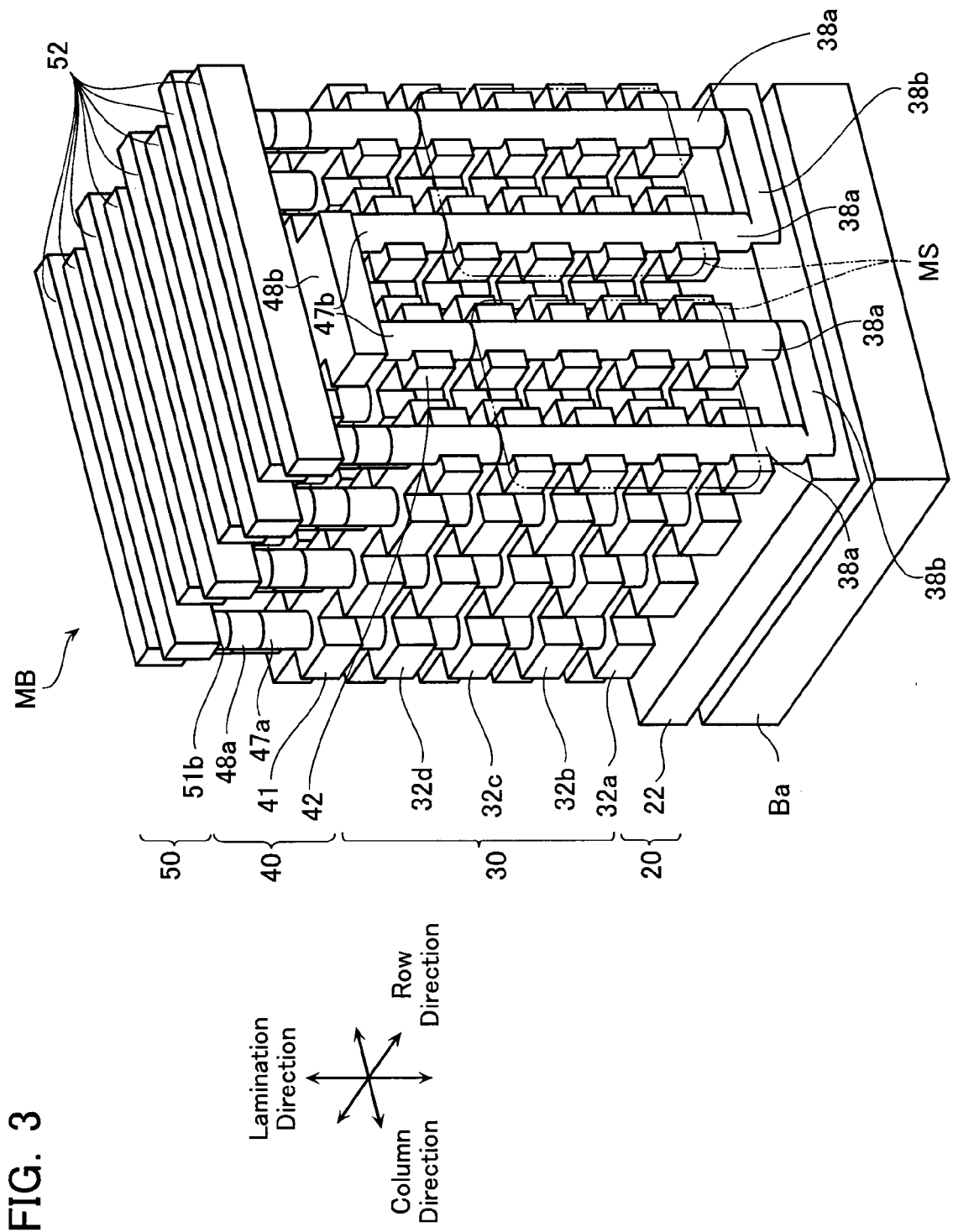
FIG. 3 is a perspective view of the non-volatile semiconductor storage device 100 according to the embodiment where some parts thereof are omitted for clarity.
Figure 4:
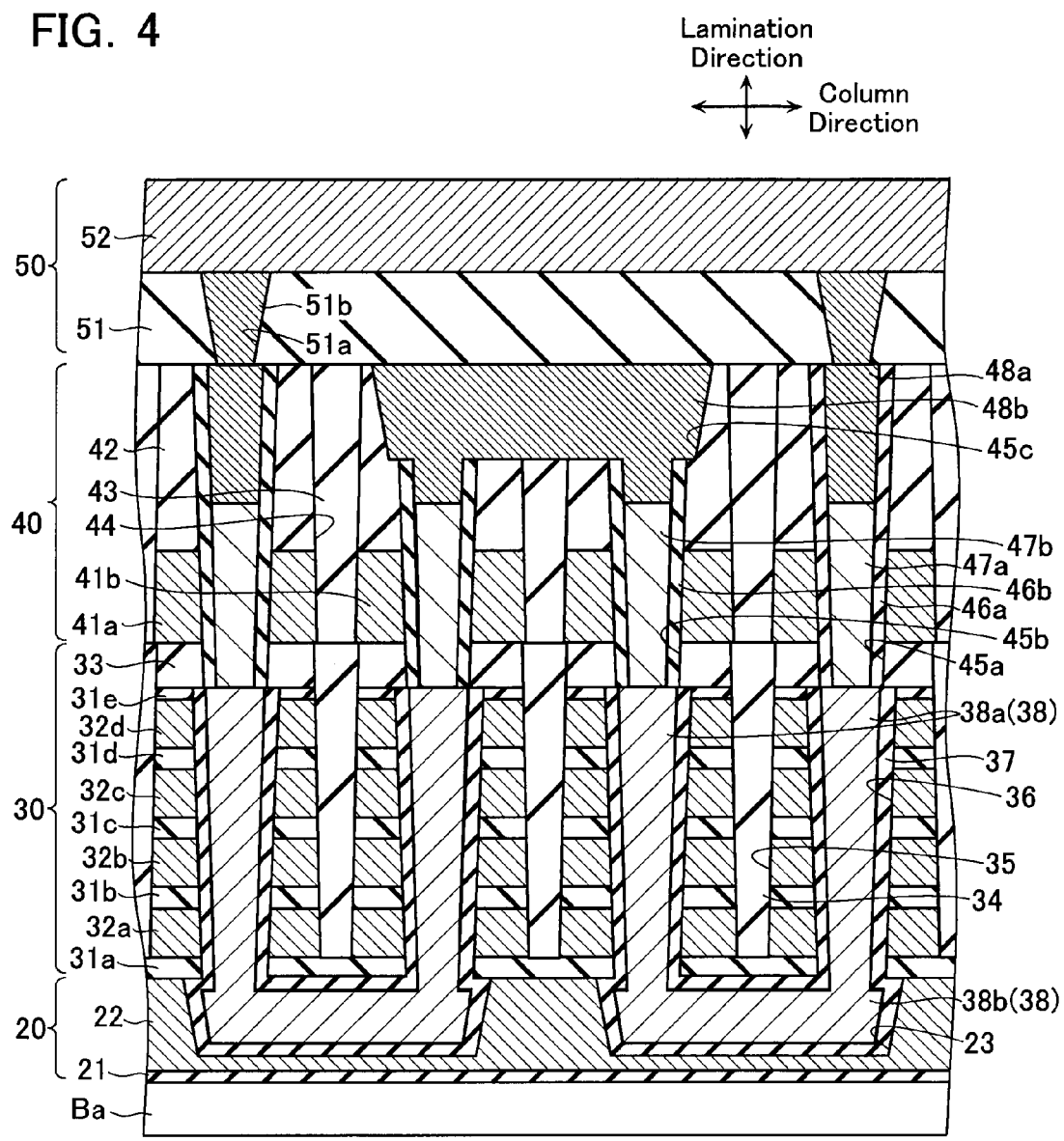
FIG. 4 is a cross-sectional view of the non-volatile semiconductor storage device 100 according to the embodiment.

Referring now to FIGS. 3 and 4, a lamination structure of the non-volatile semiconductor storage device 100 according to this embodiment that achieves the circuit configuration of FIG. 2 will be described below. FIG. 3 is a perspective view of the memory transistor area 12 in the non-volatile semiconductor storage device 100 of this embodiment where some parts are omitted for clarity, and FIG. 4 is a cross-sectional view of the memory transistor area 12.

As illustrated in FIGS. 3 and 4, the memory transistor area 12 has a back-gate transistor layer 20, a memory transistor layer 30, a selection transistor layer 40, and a wiring layer 50 that are sequentially formed in a lamination direction on a semiconductor substrate Ba. The back-gate transistor layer 20 functions as the above-mentioned back-gate transistors BTr. The memory transistor layer 30 functions as the above-mentioned memory strings MS (the memory transistors MTr1 to MTr8). The selection transistor layer 40 functions as the above-mentioned source-side selection transistors SSTr and drain-side selection transistors SDTr.

As illustrated in FIGS. 3 and 4, the back-gate transistor layer 20 has a back-gate insulation layer 21 and a back-gate conductive layer 22 that are sequentially laminated on the semiconductor substrate Ba. The back-gate insulation layer 21 and the back-gate conductive layer 22 are formed to the ends of the memory transistor area 12 so as to expand in the row and column directions.

The back-gate conductive layer 22 is formed to cover the bottom and side surfaces of joining portions 38b of U-shaped semiconductor layers 38 described below, and formed as high as the top surfaces of the joining portions 38b. The back-gate insulation layer 21 comprises silicon oxide ($SiO_2$). The back-gate conductive layer 22 comprises polysilicon (p-Si).

As illustrated in FIGS. 3 and 4, the back-gate transistor layer 20 also has back-gate holes 23 that are formed to dig into the back-gate conductive layer 22. The back-gate holes 23 include apertures having its width direction in the row direction and its longitudinal direction in the column direction.

As illustrated in FIGS. 3 and 4, the memory transistor layer 30 has first to fifth word-line insulation layers 31a to 31e, first to fourth word-line conductive layers 32a to 32d, and interlayer insulation layers 33 and 34 above the back-gate transistor layer 20.

The first to fifth word-line insulation layers 31a to 31e and the first to fourth word-line conductive layers 32a to 32d are alternately laminated on the back-gate conductive layer 22. The first word-line insulation layer 31a is formed to the ends of the memory transistor area 12 so as to expand in the row and column directions. The second to fifth word-line insulation layers 31b to 31e and the first to fourth word-line conductive layers 32a to 32d are formed in a certain shape extending in the row direction, and at a certain pitch in the column direction. In addition, the first to fifth word-line insulation layers 31a to 31e and the first to fourth word-line conductive layers 32a to 32d are processed in a stepwise manner in relation to each other at their row direction ends. Note that the constellation and shape of the first to fourth word-line conductive layers 32a to 32d will be discussed in detail below.

The interlayer insulation layers 33 are formed on the top surfaces of the fifth word-line insulation layers 31e. That is, trenches 35 that extend in the row direction are formed on the respective side surfaces of the second to fifth word-line insulation layers 31b to 31e, the first to fourth word-line conductive layers 32a to 32d, and the interlayer insulation layers 33. The interlayer insulation layers 34 are formed to fill up the trenches 35.

The first to fifth word-line insulation layers 31a to 31e and the interlayer insulation layers 33 and 34 comprise silicon oxide ($SiO_2$). The first to fourth word-line conductive layers 32a to 32d comprise polysilicon (p-Si).

As illustrated in FIGS. 3 and 4, the memory transistor layer 30 also has memory holes 36 that are formed to penetrate the first to fifth word-line insulation layers 31a to 31e and the first to fourth word-line conductive layers 32a to 32d.

The memory holes 36 are formed at respective positions near both ends in the column direction of the back-gate holes 23.

In addition, the back-gate transistor layer 20 and the memory transistor layer 30 have memory gate insulation layers 37 and U-shaped semiconductor layers 38.

As illustrated in FIG. 4, the memory gate insulation layers 37 are formed on the respective side surfaces of the memory holes 36 and the back-gate holes 23. Note that the configuration of the memory gate insulation layers will be discussed in detail below.

As illustrated in FIG. 4, each U-shaped semiconductor layer 38 is formed in a U-shape as viewed from the row direction. Each U-shaped semiconductor layer 38 is formed in contact with a respective tunnel insulation layer 37c and to fill up respective back-gate hole 23 and memory hole 36. Each U-shaped semiconductor layer 38 has a pair of columnar portions 38a that extend in a vertical direction, as viewed from the row direction, with respect to the semiconductor substrate Ba, and a joining portion 38b that is formed to join the lower ends of the pair of columnar portions 38a. The U-shaped semiconductor layers 38 comprise polysilicon (p-Si). It is desirable that each U-shaped semiconductor layer 38 has a film thickness of not less than 2 nm, which would otherwise lead to a significant degradation in mobility due to data read operation.

In the above-mentioned configuration of the back-gate transistor layer 20 and the memory transistor layer 30, the back-gate conductive layer 22 functions as the control gate electrodes of back-gate transistors BTr.

The back-gate conductive layer 22 functions as a back-gate line BG. The first to fourth word-line conductive layers 32a to 32d function as the control gate electrodes of memory transistors MTr1 to MTr8. The first to fourth word-line conductive layers 32a to 32d also function as word lines WL1 to WL8.

As illustrated in FIGS. 3 and 4, the selection transistor layer 40 has drain-side conductive layers 41a, source-side conductive layers 41b, and interlayer insulation layers 42 and 43 that are deposited on the memory transistor layer 30. The drain-side conductive layers 41a, the source-side conductive layers 41b, and the interlayer insulation layers 42 are formed in a certain shape extending in the row direction, and at a certain pitch in the column direction. Trenches 44 that extend in the row direction are formed on the respective side surfaces of the drain-side conductive layers 41a, the source-side conductive layers 41b, and the interlayer insulation layers 42. The interlayer insulation layers 43 are formed to fill up the trenches 44. Note that the constellations and shapes of the drain-side conductive layers 41a and the source-side conductive layers 41b will be discussed in detail below.

The drain-side conductive layers 41a and the source-side conductive layers 41b comprise polysilicon (p-Si). The interlayer insulation layers 42 and 43 comprise silicon oxide (SiO$_2$).

Furthermore, as illustrated in FIGS. 3 and 4, the selection transistor layer 40 has drain-side holes 45a, source-side holes 45b, and a source-line wiring trench 45c.

The drain-side holes 45a are formed to penetrate an interlayer insulation layer 42, a drain-side conductive layer 41a, and an interlayer insulation layer 33. The source-side holes 45b are formed to penetrate an interlayer insulation layer 42, a source-side conductive layer 41b, and an interlayer insulation layer 33. The drain-side holes 45a and the source-side holes 45b are formed at positions matching the memory holes 36.

The source-line wiring trench 45c is formed to dig into an interlayer insulation layer 42 to reach the upper portions of the source-side holes 45b adjacent in the column direction. The source-line wiring trench 45c is formed to join the upper portions of the source-side holes 45b adjacent in the column direction, and to extend in the row direction.

As illustrated in FIGS. 3 and 4, the selection transistor layer 40 also has drain-side gate insulation layers 46a, source-side gate insulation layers 46b, drain-side columnar semiconductor layers 47a, source-side columnar semiconductor layers 47b, plug conductive layers 48a, and source conductive layers 48b.

Each drain-side gate insulation layer 46a is formed on a side surface of a drain-side hole 45a. Each source-side gate insulation layer 46b is formed on a side surface of a source-side hole 45b. The drain-side gate insulation layers 46a and the source-side gate insulation layer 46b comprise silicon oxide (SiO$_2$).

Each drain-side columnar semiconductor layer 47a is formed to a certain height in a drain-side hole 45a so as to come in contact with a drain-side gate insulation layer 46a. Each source-side columnar semiconductor layer 47b is formed to a certain height in a source-side hole 45b so as to come in contact with a source-side gate insulation layer 46b. The drain-side columnar semiconductor layers 47a and the source-side columnar semiconductor layers 47b comprise polysilicon (p-Si).

Each plug conductive layer 48a is formed to fill up a drain-side hole 45a, from a certain height in the drain-side hole 45a to the top surface of the selection transistor layer 40. Each source conductive layer 48b is formed to fill up source-side holes 45b and a source-line wiring trench 45c, from a certain height in the source-side holes 45b to the top surface of the selection transistor layer 40. The plug conductive layers 48a and the source conductive layers 48b include a lamination structure of tungsten (W)/titanium nitride (TiN)/titanium (Ti).

In the above-mentioned configuration of the selection transistor layer 40, the drain-side conductive layers 41a function as the control gate electrodes of drain-side selection transistors SDTr. The drain-side conductive layers 41a also function as drain-side selection lines SGD. The source-side conductive layers 41b function as the control gate electrodes of source-side selection transistors SSTr. The source-side conductive layers 41b also function as source-side selection lines SGS. The source conductive layers 48b function as source lines SL.

The above-mentioned configuration of the selection transistor layer 40 is restated as follows: the drain-side gate insulation layers 46a are formed to surround the side surfaces of the drain-side columnar semiconductor layers 47a. The drain-side conductive layers 41a are formed to surround the side surfaces of the drain-side gate insulation layers 46a. The source-side gate insulation layers 46b are formed to surround the side surfaces of the source-side columnar semiconductor layers 47b. The source-side conductive layers 41b are formed to surround the side surfaces of the source-side gate insulation layers 46b.

As illustrated in FIGS. 3 and 4, the wiring layer 50 has an interlayer insulation layer 51, holes 51a, plug layers 51b, and bit-line layers 52.

The interlayer insulation layer 51 is formed on the top surface of the selection transistor layer 40. The holes 51a are formed to penetrate the interlayer insulation layer 51 at positions matching the drain-side holes 45a. The plug layers 51b are formed to fill up the holes 51a up to the top surface of the interlayer insulation layer 51. The bit-line layers 52 are formed in a stripe pattern extending in the column direction, and at a certain pitch in the row direction, so as to come in contact with the top surfaces of the plug layers 51b. The interlayer insulation layer 51 comprises silicon oxide (SiO$_2$). The plug layers 51b and the bit-line layers include a lamination structure of tungsten (W)/titanium nitride (TiN)/titanium (Ti).

In the above-mentioned configuration of the wiring layer 50, the bit-line layers 52 function as bit lines BL.

Figure 5:
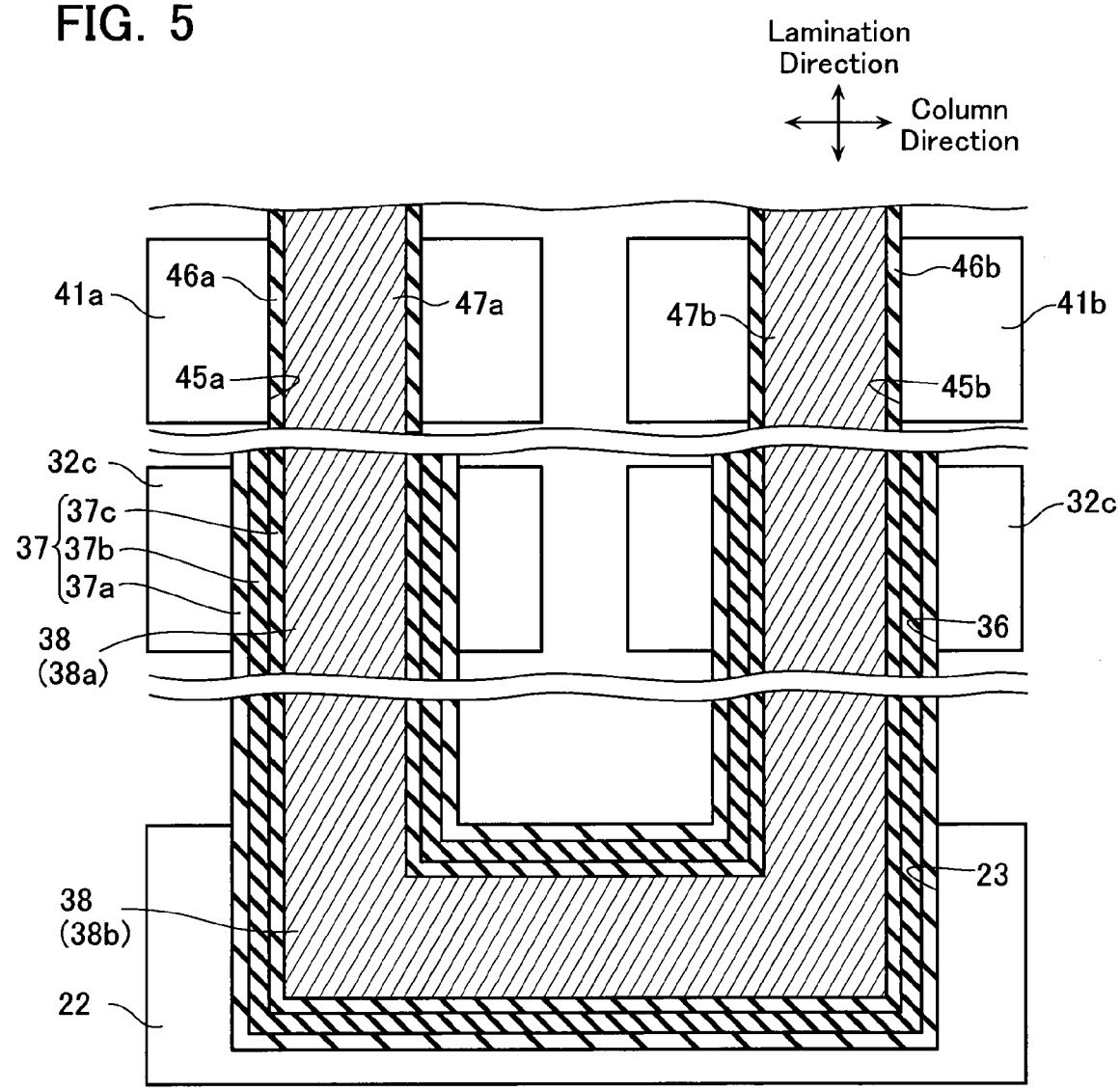
FIG. 5 is a partial enlarged view of FIG. 4.

Referring now to FIG. 5, the configuration of the memory gate insulation layers 37 will be described in detail below. FIG. 5 is a partial enlarged view of FIG. 4.

As illustrated in FIG. 5, each memory gate insulation layer 37 includes a block insulation layer 37a, an electric charge accumulation layer 37b, and a tunnel insulation layer 37c that are sequentially laminated, in the stated order, on the side surface of a memory hole 36 and a back-gate hole 23. Each block insulation layer 37a and each tunnel insulation layer 37c comprise silicon oxide (SiO$_2$). Each electric charge accumulation layer 37b comprises silicon nitride (SiN).

It is desirable that each block insulation layer 37a has a sufficient film thickness, e.g., not less than 10 nm, to prevent reverse injection of electrons from any gate electrodes during data erase operation. It is also desirable that each electric charge accumulation layer 37b has a film thickness of, e.g., at least 1 nm or more to obtain sufficient trapping efficiency to trap such electrons that transverse a respective tunnel insulation layer 37c. Additionally, it is desirable that each tunnel insulation layer 37c has a film thickness of at least 4 nm or more to minimize incorrect write associated with the data read operations and ensure data retention.

The above-mentioned configuration of the memory transistor layer 30 is restates as follows: each tunnel insulation layer 37c is formed to surround the side surface of a respective columnar portion 38a. Each electric charge accumulation layer 37b is formed to surround the side surface of a respective tunnel insulation layer 37c. Each block insulation layer 37a is formed to surround the side surface of a respective electric charge accumulation layer 37b. The first to fourth word-line conductive layers 32a to 32d are formed to surround the side surface of a respective block insulation layer 37a.

Figure 6A:
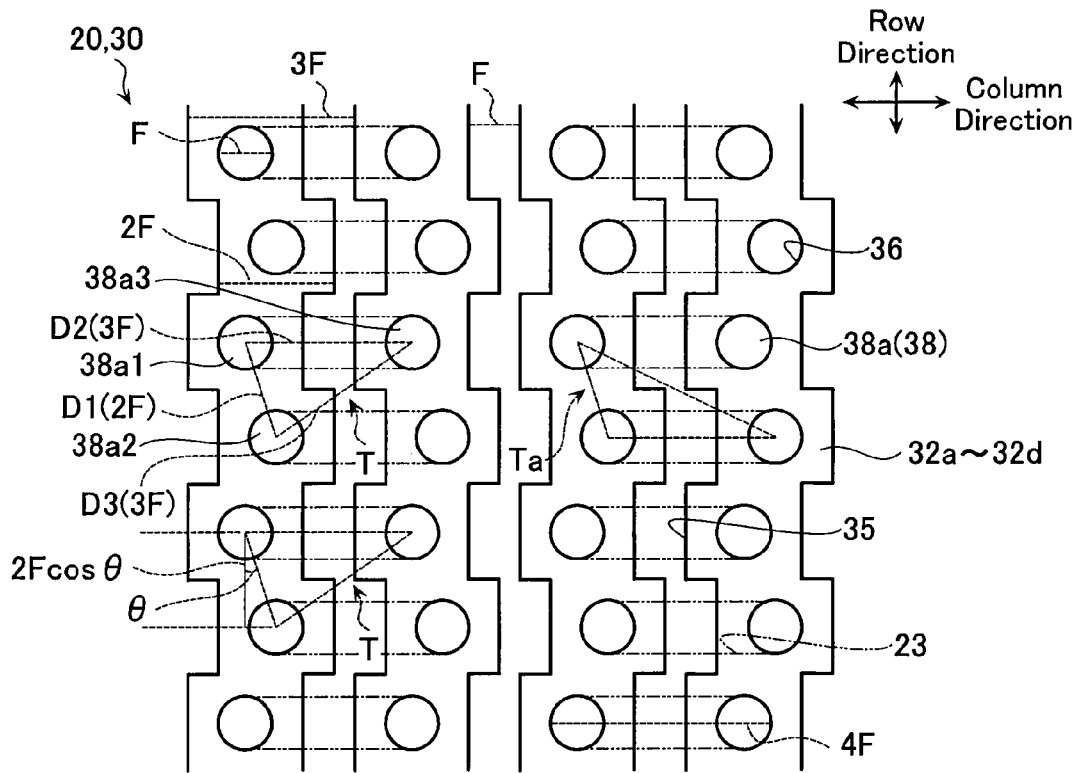
FIG. 6A is a top plan view of a back-gate transistor layer 20 and a memory transistor layer 30 according to the embodiment, where some parts thereof are omitted for clarity.

Referring now to FIG. 6A, the respective constellations and shapes of the U-shaped semiconductor layers 38 and the first to fourth word-line conductive layers 32a to 32d will be described below. FIG. 6A is a top plan view of the back-gate transistor layer 20 and the memory transistor layer 30 according to the embodiment, where some parts thereof are omitted for clarity.

As illustrated in FIG. 6A, the U-shaped semiconductor layers 38 are aligned at a first pitch in the column direction, and arranged in a staggered pattern at a second pitch in the row direction. Each columnar portion 38a has a diameter of F. The columnar portions 38a are aligned at a first pitch 3F in the column direction, and arranged in a staggered pattern at the second pitch in the row direction. In this case, the second pitch is less than 2F. Note that the specific length of the second pitch will be discussed later.

As used herein, the phrase "arranged in a staggered pattern" means the following arrangement: the $2n-1^{th}$ (n is an integer equal to or greater than 1) columnar portions 38a in the row direction are aligned in the row direction, and the $2n^{th}$ columnar portions 38a in the row direction are aligned in the row direction. In addition, the arrangement is such that when drawing a serrated line folded in a zig-zag pattern, centered along the row direction, the columnar portions 38a are located at the corners of the line.

In this case, an arbitrary columnar portion 38a is defined as a "first columnar portion 38a1". A columnar portion 38a adjacent to the first columnar portion 38a1 in the row direction is defined as a "second columnar portion 38a2". A columnar portion 38a adjacent to the first columnar portion 38a1 in the column direction is defined as a "third columnar portion 38a3". In addition, a line segment connecting the center of a first columnar portion 38a1 to the center of a second columnar portion 38a2 is defined as a "first side D1". A line segment connecting the center of a first columnar portion 38a1 to the center of a third columnar portion 38a3 is defined as a "second side D2". A line segment connecting the center of a second columnar portion 38a2 to the center of a third columnar portion 38a3 is defined as a "third side D3". In addition, a triangle formed by these first to third sides D1 to D3 is defined as a "triangle T".

The triangle T is one of the triangles formed by connecting the centers of respective three columnar portions 38a that has the smallest sum of the three sides. For example, the sum of the three sides of a triangle Ta illustrated in FIG. 6A is greater than that of the three sides of the triangle T (D1+D2+D3).

The first side D1 is inclined by an angle θ with respect to the row direction. The first side D1 has a length of "2F". The second side D2 has a length of "3F". The third side D3 has the same length as the second side D2, i.e., "3F". That is, the triangle T includes two equal length sides, providing an isosceles triangle.

The angle θ is an angle for the triangle T to be an isosceles triangle (2:3:3), and specifically, it is substantially 19°. In addition, the second pitch is 2F cos θ, and specifically, it is substantially 1.89F.

The above-mentioned configuration of the U-shaped semiconductor layers 38 is restated as follows: the back-gate holes 23 are aligned at a pitch 6F in the column direction, and arranged in a staggered pattern at a second pitch 2F cos θ in the row direction, as illustrated in FIG. 6A. Each back-gate hole 23 has a length of F in the width direction and 4F in the longitudinal direction. The memory holes 36 are aligned at the first pitch 3F in the column direction, and arranged in a staggered pattern at the second pitch 2F cos θ in the row direction. Each memory hole 36 has a diameter of F.

As illustrated in FIG. 6A, the first to fourth word-line conductive layers 32a to 32d are configured to be arranged at the pitch 3F in the column direction, and extend to curve in a wave-like fashion in the row direction along the staggered-pattern arrangement of the columnar portions 38a. The first to fourth word-line conductive layers 32a to 32d are each formed with a width of 2F in the column direction.

Figure 6B:
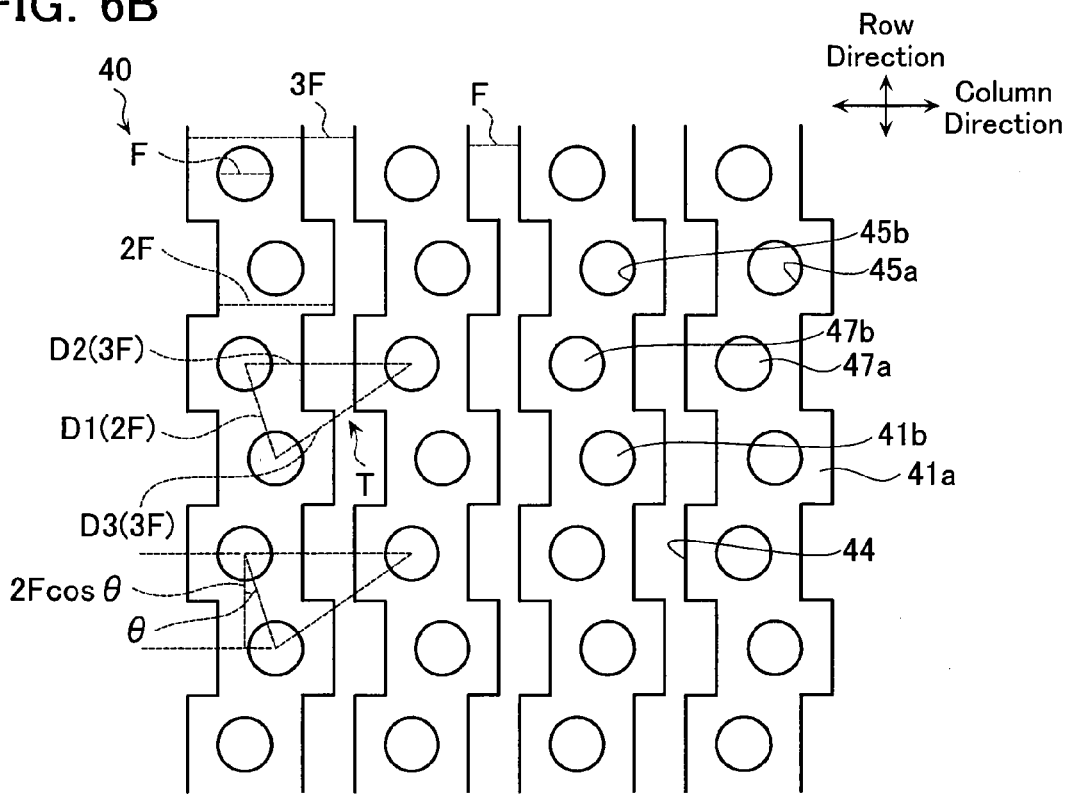
FIG. 6B is a top plan view of a selection transistor layer 40 according to the embodiment, where some parts thereof are omitted for clarity.

Referring now to FIG. 6B, the constellations of the drain-side columnar semiconductor layers 47a and the source-side columnar semiconductor layers 47b, the constellations of the drain-side conductive layers 41a and the source-side conductive layers 41b, and their shapes will be described below. FIG. 6B is a top plan view of the selection transistor layer 40 according to the embodiment, where some parts thereof are omitted for clarity.

As illustrated in FIG. 6B, the drain-side columnar semiconductor layers 47a and the source-side columnar semiconductor layers 47b are aligned in the column direction, and arranged in a staggered pattern at the second pitch in the row direction. Each drain-side columnar semiconductor layer 47a and each source-side columnar semiconductor layer 47b have a diameter of F, respectively. The drain-side columnar semiconductor layers 47a and the source-side columnar semiconductor layers 47b are aligned at the first pitch 3F in the column direction, and arranged in a staggered pattern at the second pitch 2F cos θ in the row direction.

As in the above-mentioned columnar portions 38a, FIG. 6B illustrates a triangle T that is formed by connecting the centers of adjacent three layers: one drain-side columnar semiconductor layer 47a and two source-side columnar semiconductor layers 47b. The triangle T is one of the triangles formed by connecting the center(s) of one (or two) drain-side columnar semiconductor layer(s) 47a with the centers (or center) of two (or one) source-side columnar semiconductor layers (or layer) 47b that has the smallest sum of the three sides. As described above, the triangle T provides an isosceles triangle. Note that the triangle T may be formed by connecting the centers of adjacent two drain-side columnar semiconductor layers 47a with the center of one source-side columnar semiconductor layer 47b.

The above-mentioned configuration of the drain-side columnar semiconductor layers 47a and the source-side columnar semiconductor layers 47b is restated as follows: the drain-side holes 45a and the source-side holes 45b are aligned at the first pitch 3F in the column direction, and arranged in a staggered pattern at the second pitch 2F cos θ in the row direction, as illustrated in FIG. 6B.

As illustrated in FIG. 6B, the drain-side conductive layers 41a and the source-side conductive layers 41b are configured to be arranged at the first pitch 3F in the column direction, and extend to curve in a wave-like fashion in the row direction along the staggered-pattern arrangement of the drain-side columnar semiconductor layers 47a and the source-side columnar semiconductor layers 47b. Each drain-side conductive layer 41a and each source-side conductive layer 41b are formed with a width of 2F in the column direction, respectively.

(Manufacturing Method of Non-Volatile Semiconductor Storage Device 100 according to this Embodiment)

Referring now to FIGS. 7 to 26, a manufacturing method of the non-volatile semiconductor storage device 100 according to the embodiment will be described below. FIGS. 7, 8, 10, 12, 13, 15, 16, 18, and 19, as well as FIGS. 21 to 26 are cross-sectional views in a manufacturing process of the non-volatile semiconductor storage device 100 according to the embodiment. FIGS. 9, 11, 14, 17, and 20 are top plan views in the manufacturing process of the non-volatile semiconductor storage device 100 according to the embodiment.

Figure 7:
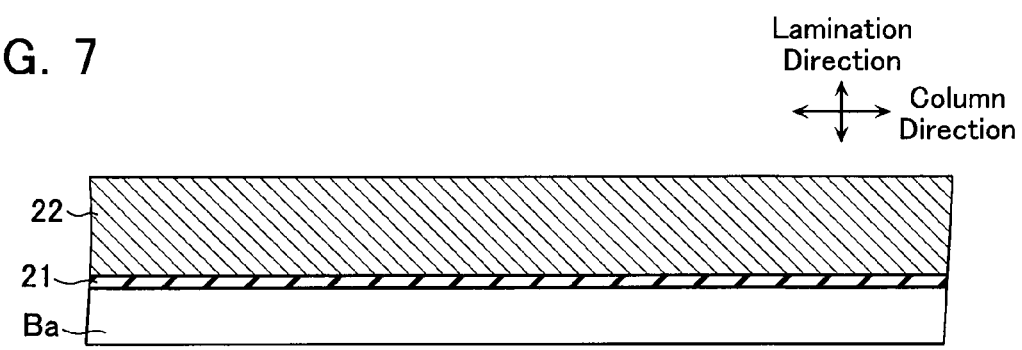
FIG. 7 is a cross-sectional view of the non-volatile semiconductor storage device 100 in a manufacturing process according to the embodiment.

Firstly, as illustrated in FIG. 7, silicon oxide ($SiO_2$) and polysilicon (p-Si) are deposited on the semiconductor substrate Ba to form a back-gate insulation layer 21 and a back-gate conductive layer 22.

Figure 8:
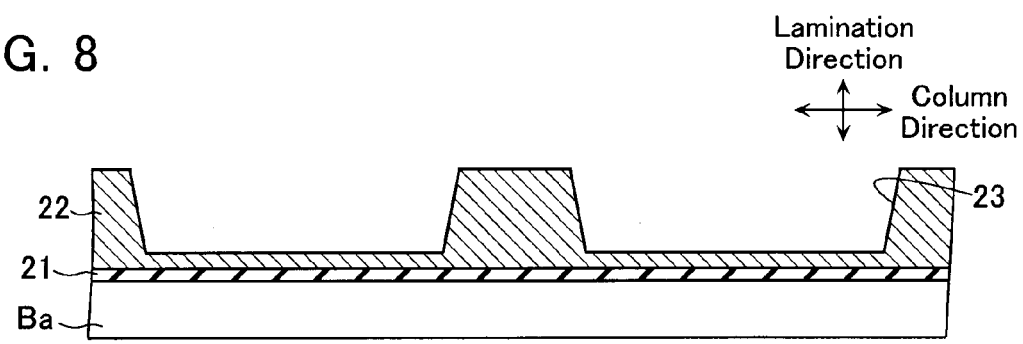
FIG. 8 is a cross-sectional view of the non-volatile semiconductor storage device 100 in the manufacturing process according to the embodiment.
Figure 9:
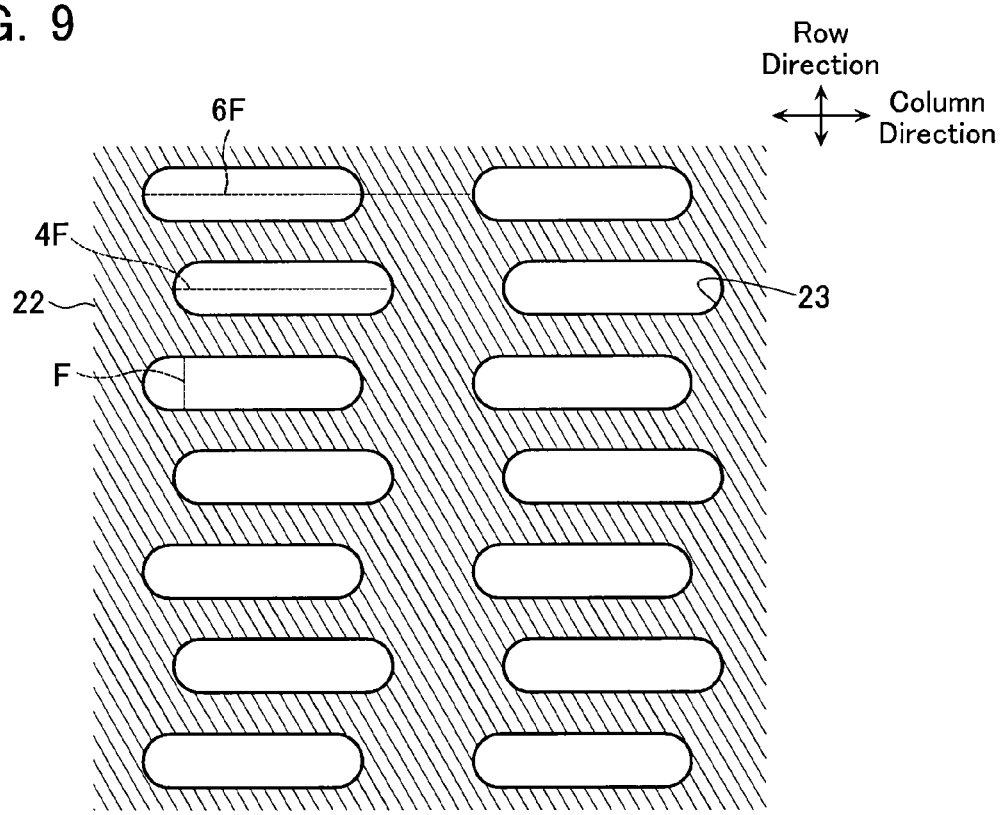
FIG. 9 is a top plan view of the non-volatile semiconductor storage device 100 in the manufacturing process according to the embodiment.

Then, as illustrated in FIGS. 8 and 9, a lithography or RIE (Reactive Ion Etching) method is used to dig into the back-gate conductive layer 22, thereby forming back-gate holes 23.

In this case, the back-gate holes 23 are formed to be aligned in the column direction, and arranged in a staggered pattern along the row direction. The back-gate holes 23 are formed with a length of 3F in the width direction and 4F in the longitudinal direction. The back-gate holes 23 are formed at a certain pitch 6F in the column direction.

Figure 10:
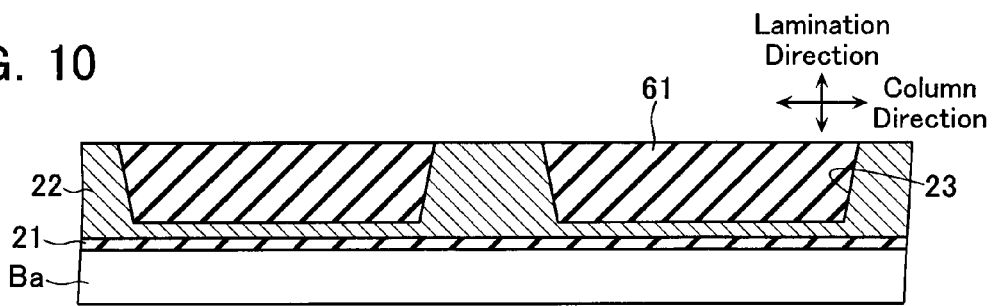
FIG. 10 is a cross-sectional view of the non-volatile semiconductor storage device 100 in the manufacturing process according to the embodiment.
Figure 11:
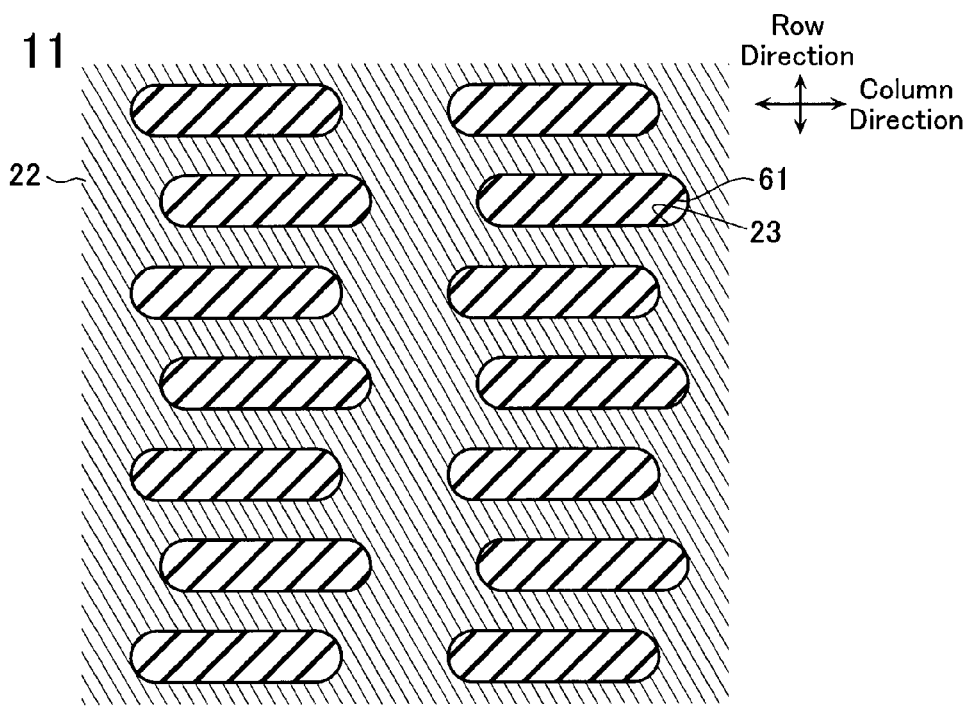
FIG. 11 is a top plan view of the non-volatile semiconductor storage device 100 in the manufacturing process according to the embodiment.

Subsequently, as illustrated in FIGS. 10 and 11, silicon nitride (SiN) is deposited to fill up the back-gate holes 23, by which sacrificial layers 61 are formed.

Figure 12:
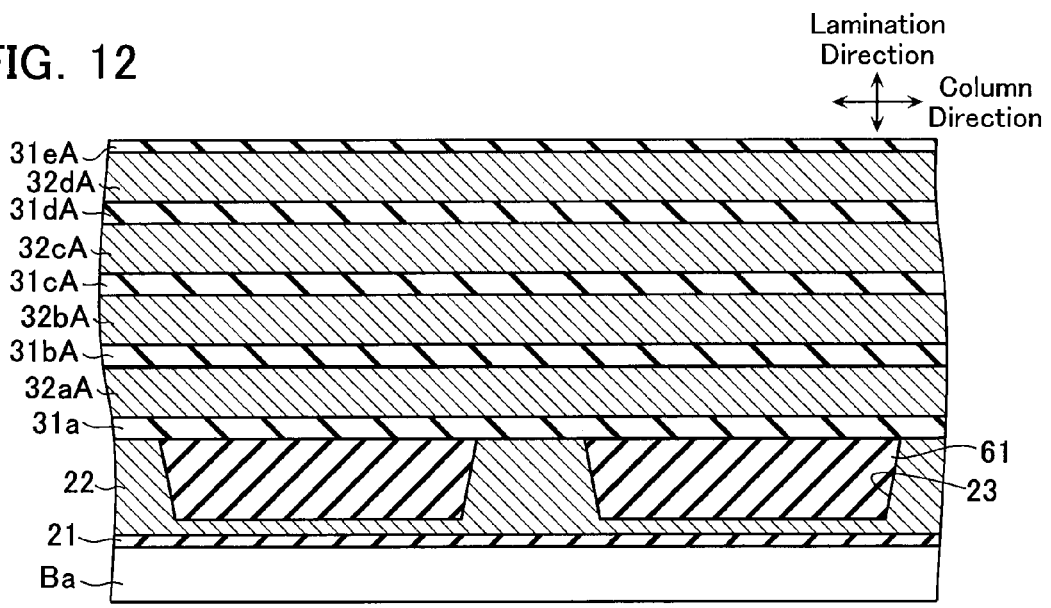
FIG. 12 is a cross-sectional view of the non-volatile semiconductor storage device 100 in the manufacturing process according to the embodiment.

Then, as illustrated in FIG. 12, silicon oxide ($SiO_2$) and polysilicon (p-Si) are alternately deposited on the back-gate conductive layer 22 and the sacrificial layers 61 to form a first word-line insulation layer 31a, layers 31bA to 31eA, and layers 32aA to 32dA.

Figure 13:
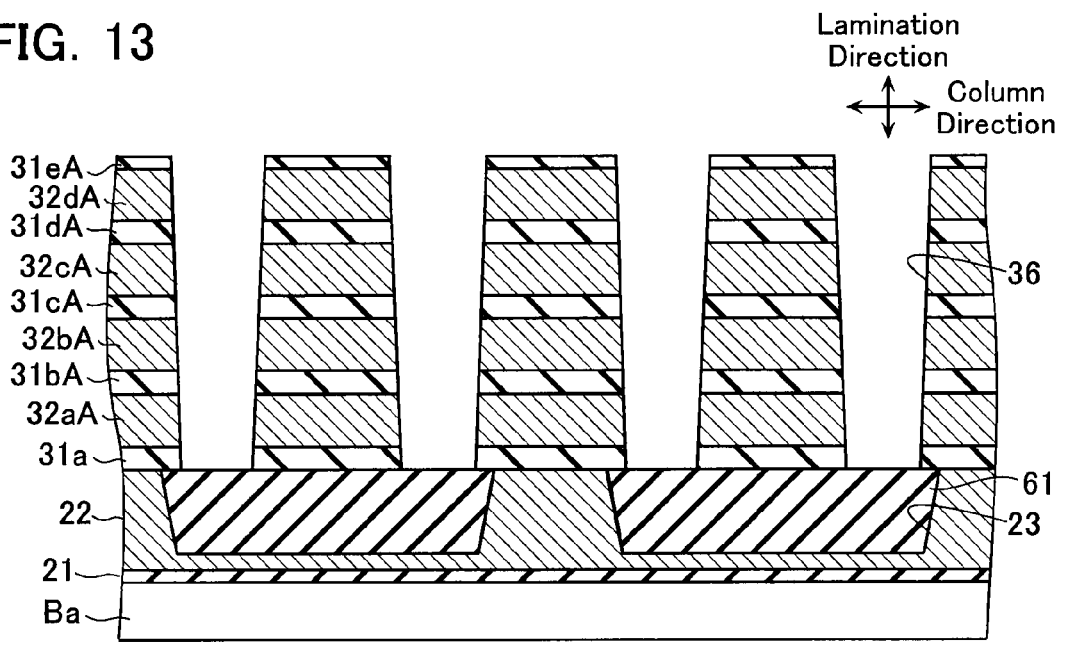
FIG. 13 is a cross-sectional view of the non-volatile semiconductor storage device 100 in the manufacturing process according to the embodiment.
Figure 14:
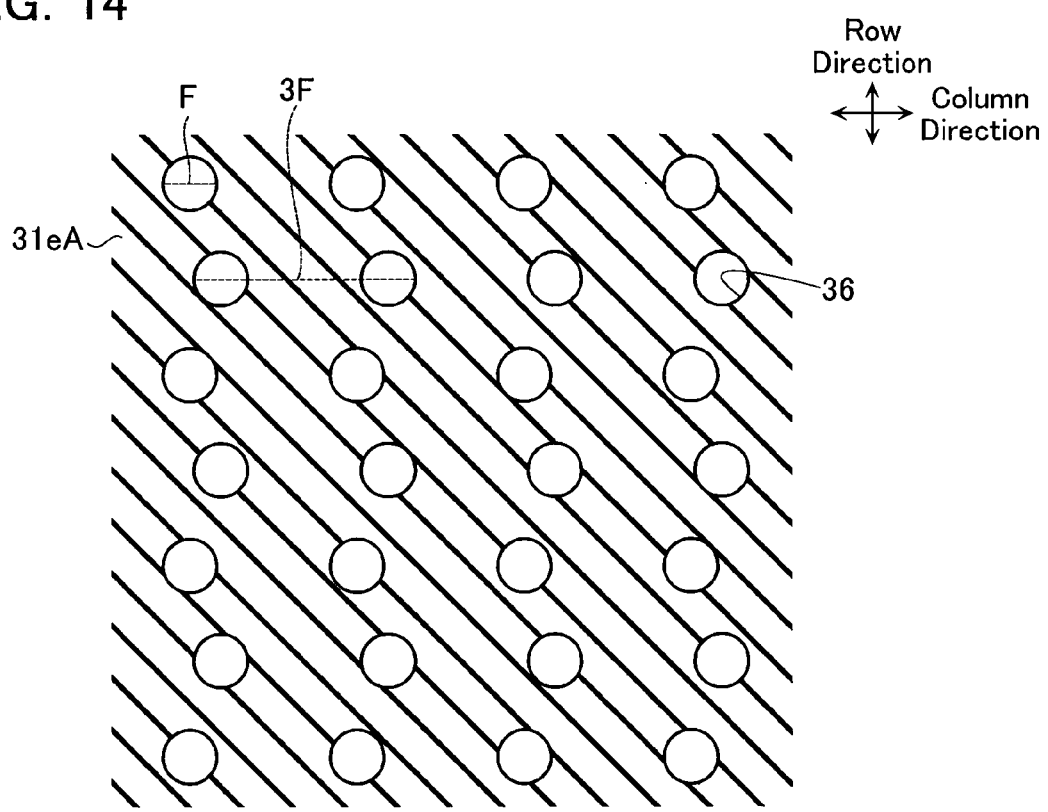
FIG. 14 is a top plan view of the non-volatile semiconductor storage device 100 in the manufacturing process according to the embodiment.

Then, as illustrated in FIGS. 13 and 14, memory holes 36 are formed to penetrate the first word-line insulation layer 31a, the layers 31bA to 31eA, and the layers 32aA to 32dA. The memory holes 36 are formed to reach the top surfaces at each end in the column direction of the sacrificial layers 61. That is, the memory holes 36 are formed to be aligned at the first pitch 3F in the column direction, and arranged in a staggered pattern at the second pitch $2F \cos \theta$ (less than 2F) in the row direction. Each memory hole 36 has a diameter of F.

Figure 15:
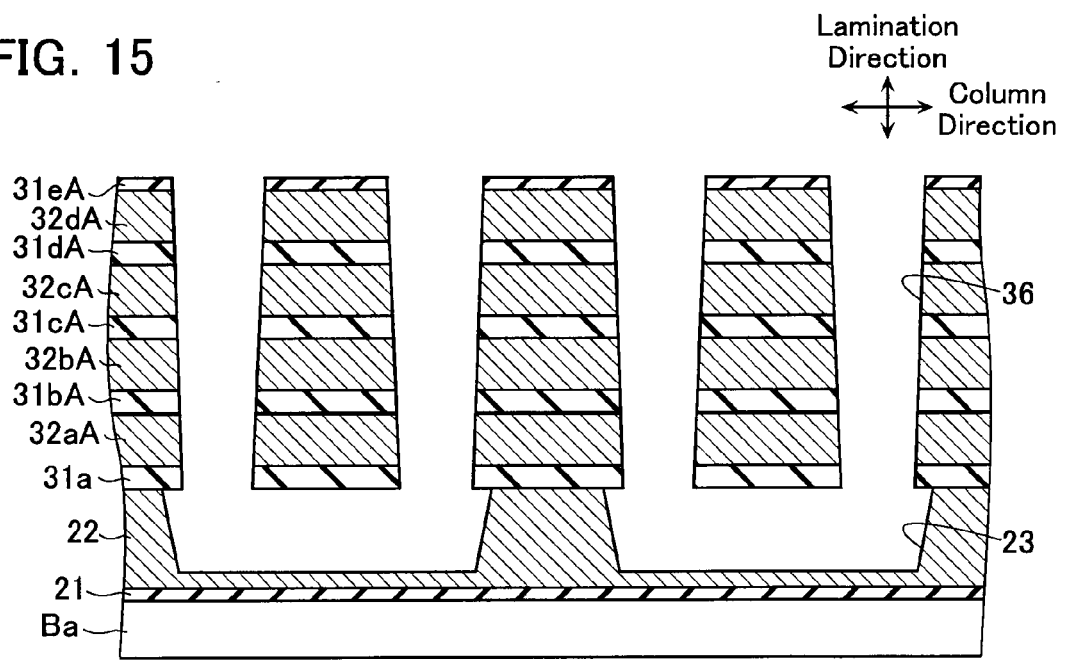
FIG. 15 is a cross-sectional view of the non-volatile semiconductor storage device 100 in the manufacturing process according to the embodiment.

Then, as illustrated in FIG. 15, a hot phosphoric acid treatment is performed to remove the sacrificial layers 61 via the memory holes 36.

Figure 16:
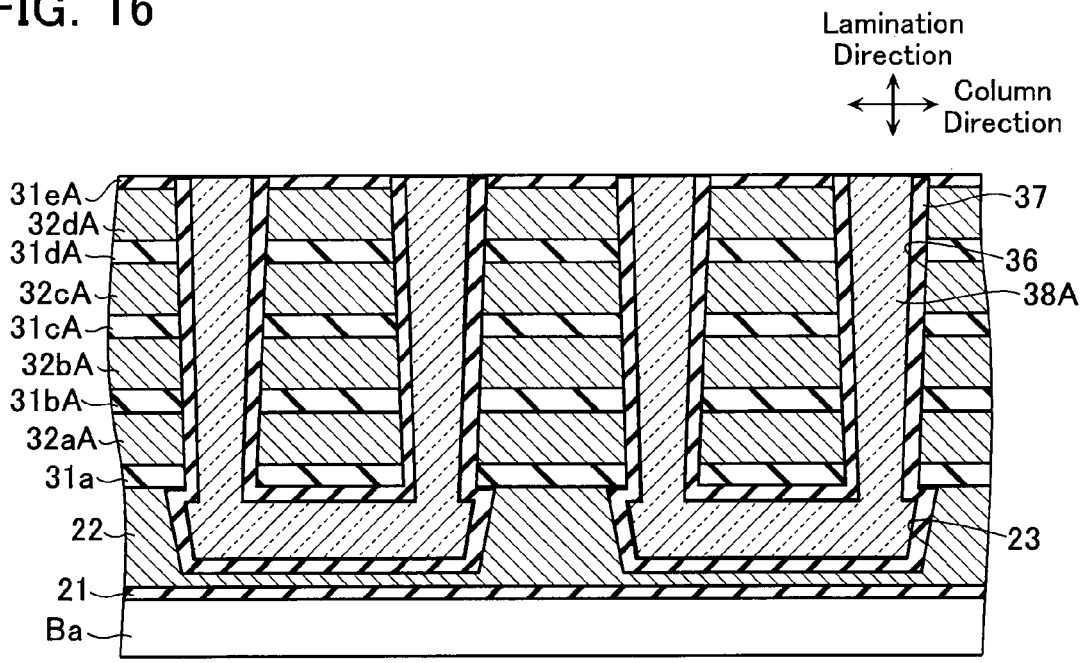
FIG. 16 is a cross-sectional view of the non-volatile semiconductor storage device 100 in the manufacturing process according to the embodiment.
Figure 17:
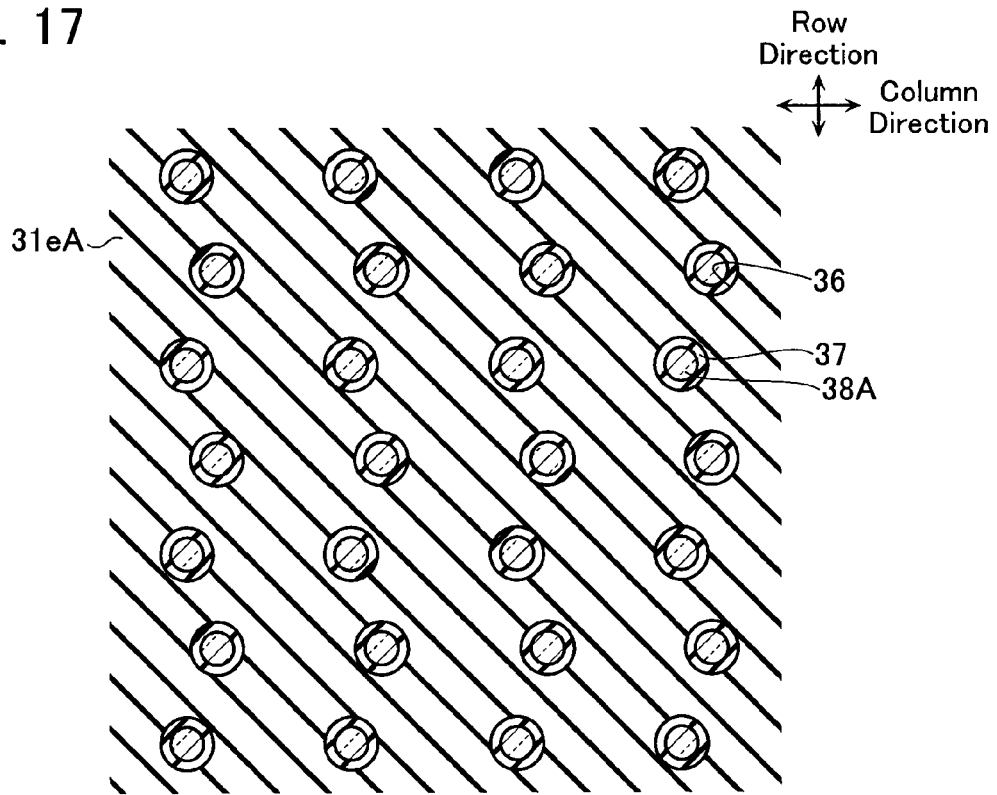
FIG. 17 is a top plan view of the non-volatile semiconductor storage device 100 in the manufacturing process according to the embodiment.

Subsequently, as illustrated in FIGS. 16 and 17, silicon oxide ($SiO_2$), silicon nitride (SiN), silicon oxide ($SiO_2$), and amorphous silicon (a-Si) are sequentially deposited to fill up the memory holes 36 and the back-gate holes 23. Through this step, memory gate insulation layers 37 and amorphous silicon layers 38A are formed on the respective side surfaces of the memory holes 36 and the back-gate holes 23. That is, in the amorphous silicon layers 38A, columnar portions extending in a columnar fashion are formed to be aligned at the first pitch F in the column direction, and arranged in a staggered pattern at the second pitch $2F \cos \theta$ in the row direction.

Figure 18:
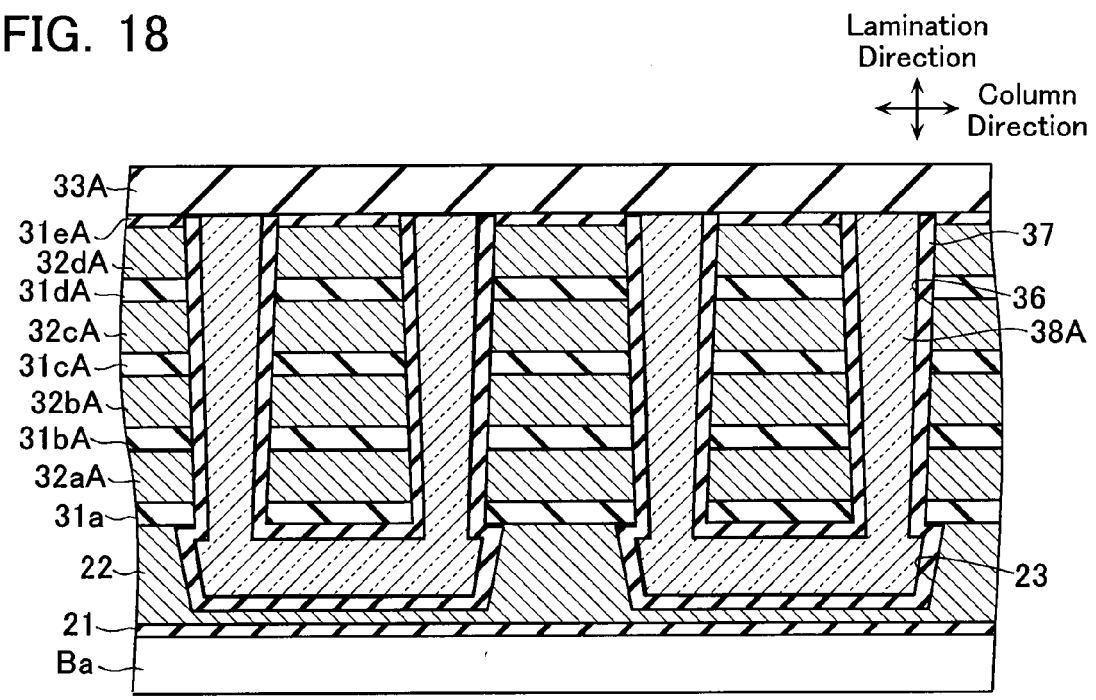
FIG. 18 is a cross-sectional view of the non-volatile semiconductor storage device 100 in the manufacturing process according to the embodiment.

Subsequently, as illustrated in FIG. 18, silicon oxide ($SiO_2$) is deposited on the top surfaces of the layers 31eA to form a layer 33A.

Figure 19:
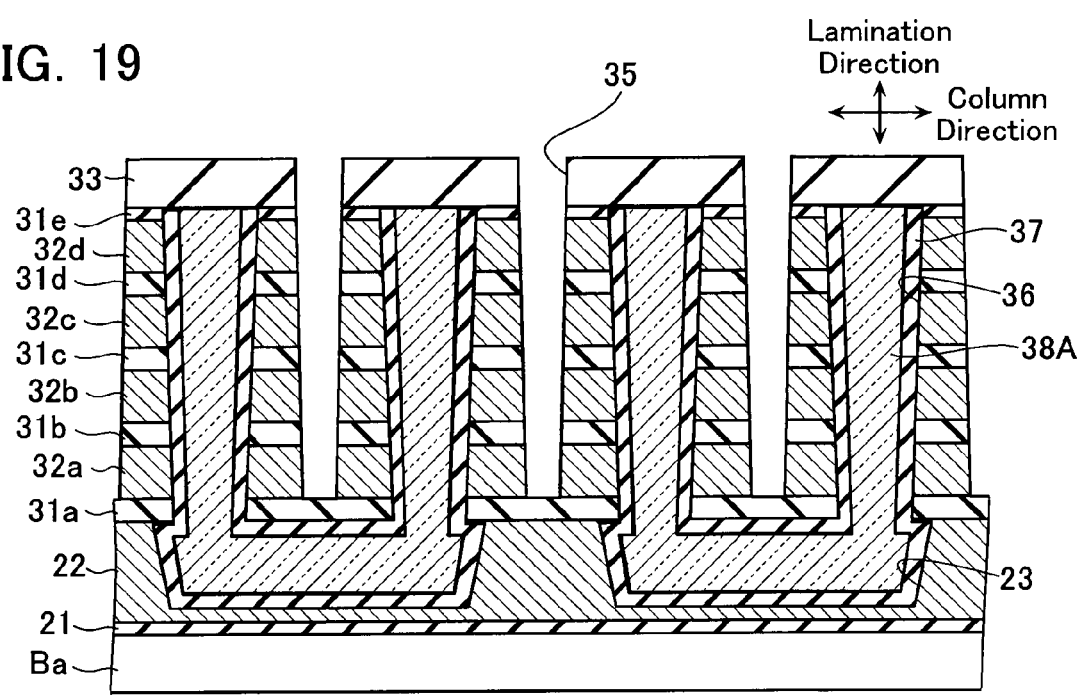
FIG. 19 is a cross-sectional view of the non-volatile semiconductor storage device 100 in the manufacturing process according to the embodiment.
Figure 20:
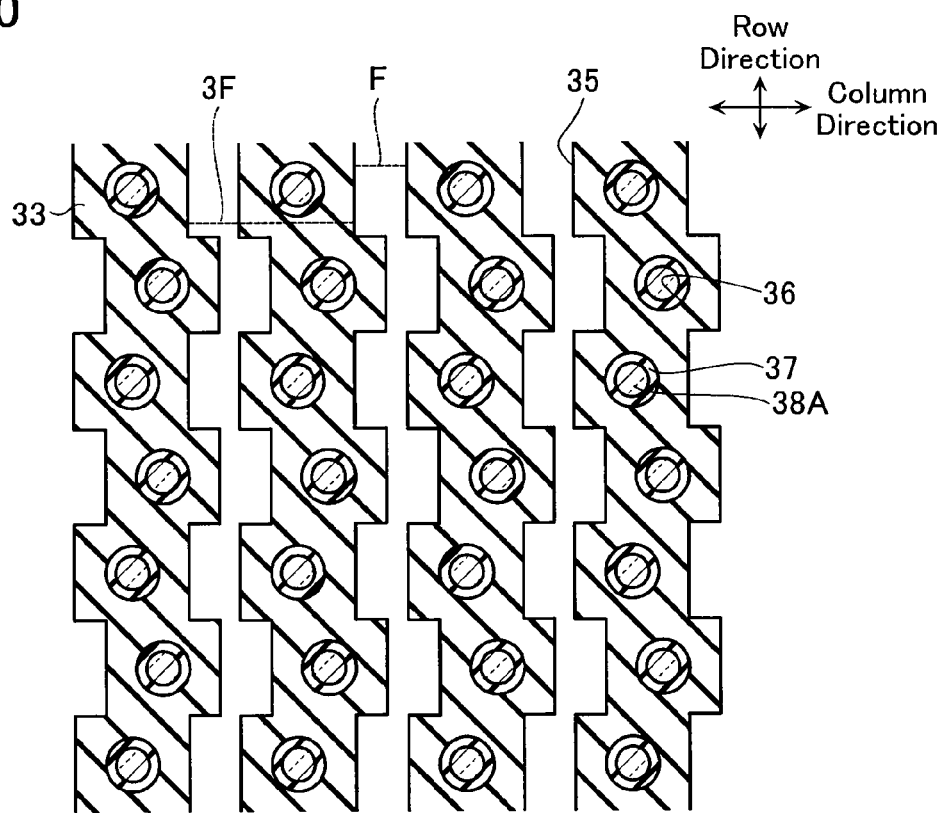
FIG. 20 is a top plan view of the non-volatile semiconductor storage device 100 in the manufacturing process according to the embodiment.

Then, as illustrated in FIGS. 19 and 20, trenches 35 are formed to penetrate the layer 33A, the layers 31bA to 31eA, and the layers 32aA to 32dA. Each trench 35 is formed between respective memory holes 36 adjacent in the column direction. The trenches 35 are configured to be arranged at the first pitch 3F in the column direction, and extend to curve in a wave-like fashion in the row direction along the staggered-pattern arrangement of the memory holes 36. Each trench 35 is formed with a width of F. Through this step, the layers 31bA to 31eA provide second to fifth word-line insulation layers 31b to 31e. The layers 32aA to 32dA provide first to fourth word-line conductive layers 32a to 32d. The layer 33A provides interlayer insulation layers 33.

Figure 21:
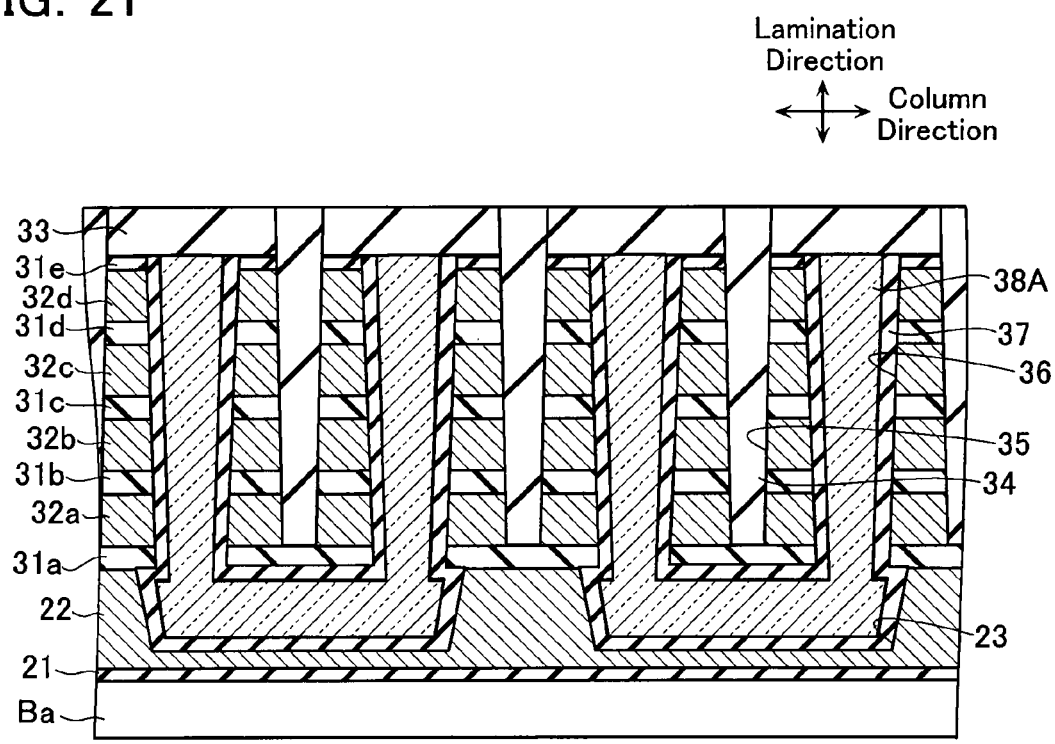
FIG. 21 is a cross-sectional view of the non-volatile semiconductor storage device 100 in the manufacturing process according to the embodiment.

Then, as illustrated in FIG. 21, silicon oxide ($SiO_2$) is deposited to fill up the trenches 35, by which interlayer insulation layers 34 are formed.

Figure 22:
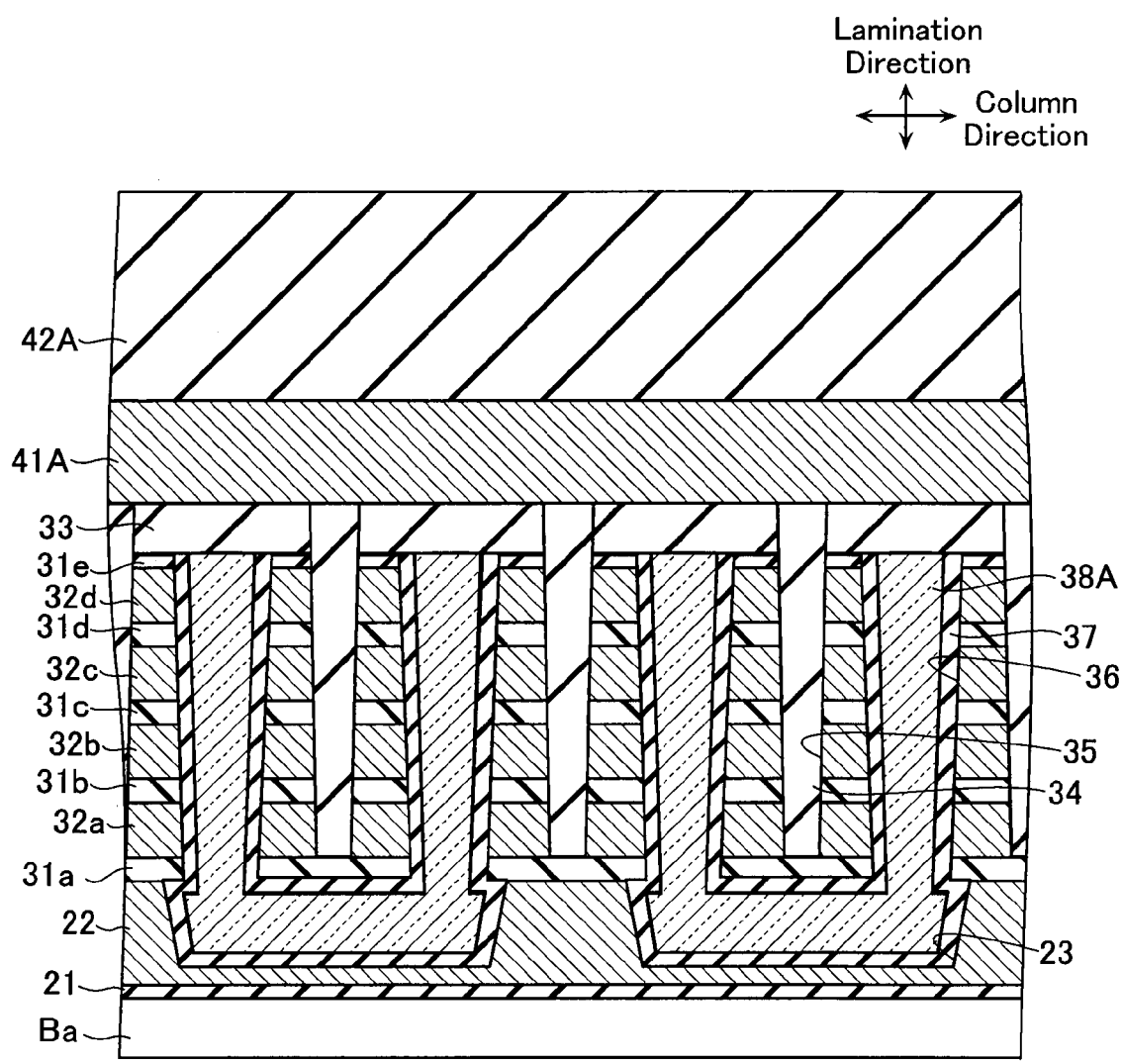
FIG. 22 is a cross-sectional view of the non-volatile semiconductor storage device 100 in the manufacturing process according to the embodiment.

Then, as illustrated in FIG. 22, polysilicon (p-Si) and silicon oxide ($SiO_2$) are deposited on the top surfaces of the interlayer insulation layers 33 to form layers 41A and 42A.

Figure 23:
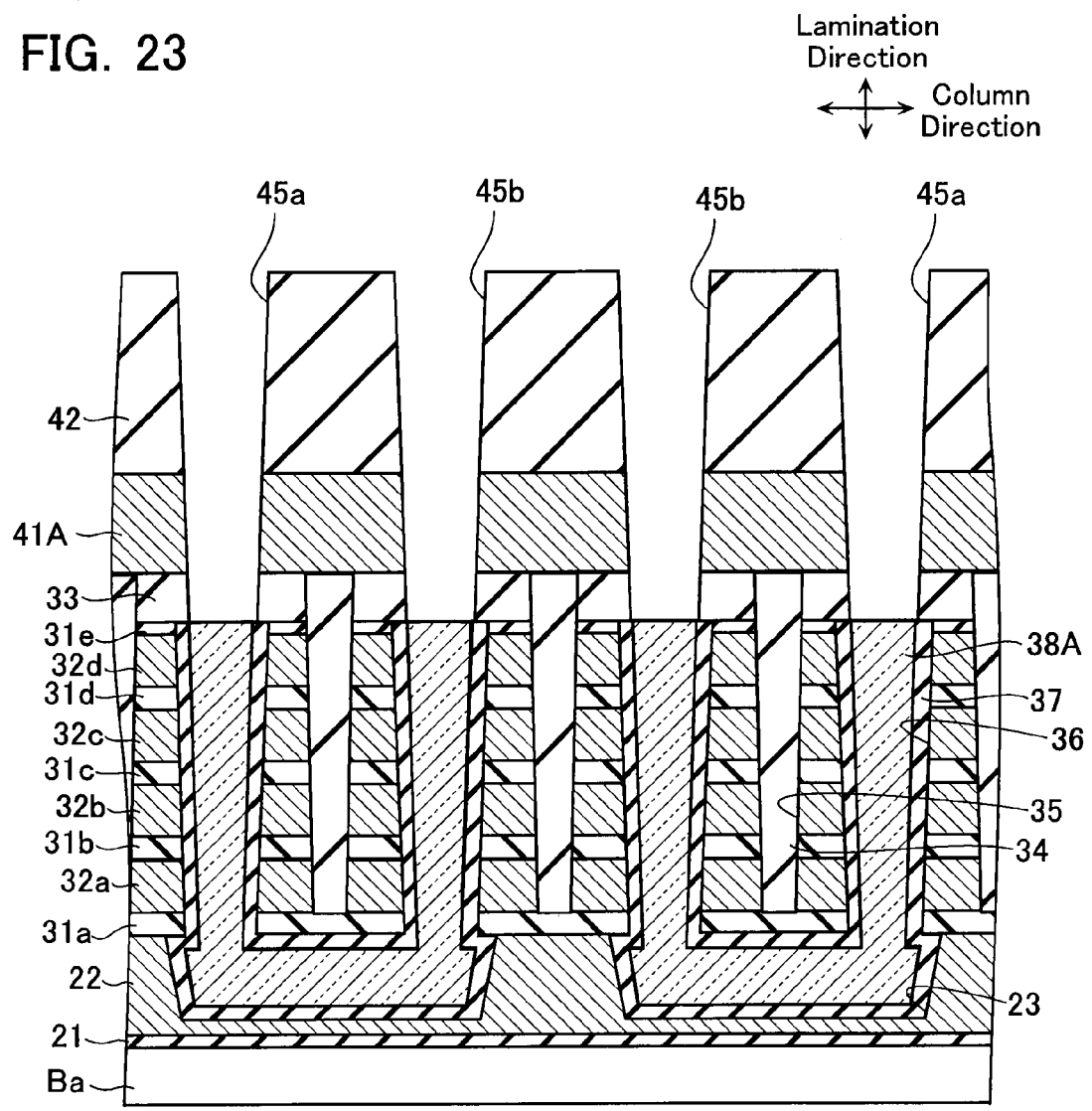
FIG. 23 is a cross-sectional view of the non-volatile semiconductor storage device 100 in the manufacturing process according to the embodiment.

Then, as illustrated in FIG. 23, drain-side holes 45a and source-side holes 45b are formed to penetrate the layer 42A, the layer 41A, and the interlayer insulation layers 33. The drain-side holes 45a and the source-side holes 45b are formed at respective positions matching the memory holes 36. That is, the drain-side holes 45a and the source-side holes 45b are formed to be aligned at the first pitch 3F in the column direction, and arranged in a staggered pattern at the second pitch $2F \cos \theta$ in the row direction.

Figure 24:
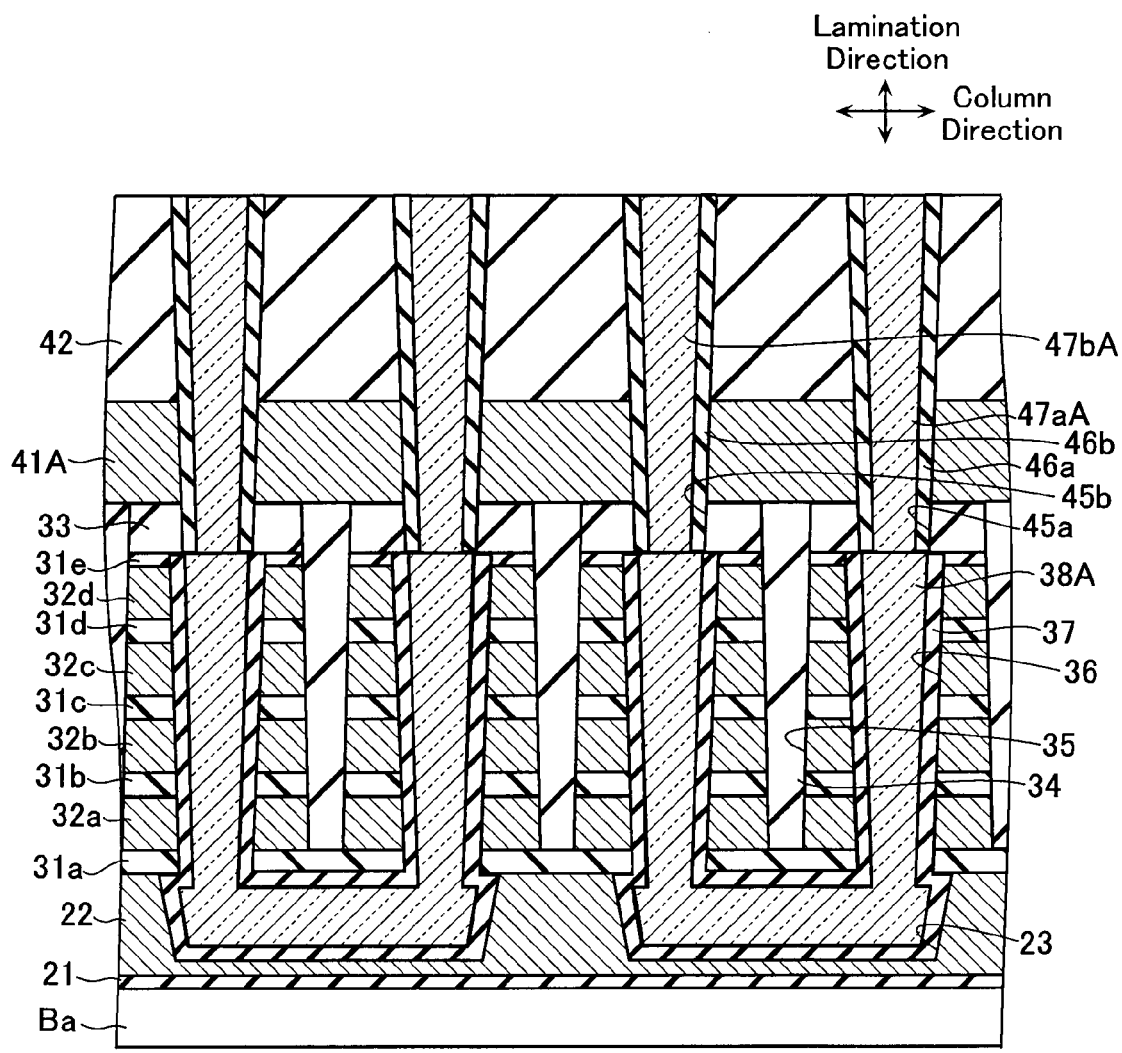
FIG. 24 is a cross-sectional view of the non-volatile semiconductor storage device 100 in the manufacturing process according to the embodiment.

Then, as illustrated in FIG. 24, silicon oxide ($SiO_2$) and amorphous silicon (a-Si) are sequentially deposited on the respective sidewalls of the drain-side holes 45a and the source-side holes 45b. Through this step, drain-side gate insulation layers 46a are formed on the sidewalls of the drain-side holes 45a. Amorphous silicon layers 47aA are formed to fill up the drain-side holes 45a. In addition, source-side gate insulation layers 46b are formed on the sidewalls of the source-side holes 45b. Amorphous silicon layers 47bA are formed to fill up the source-side holes 45b.

Figure 25:
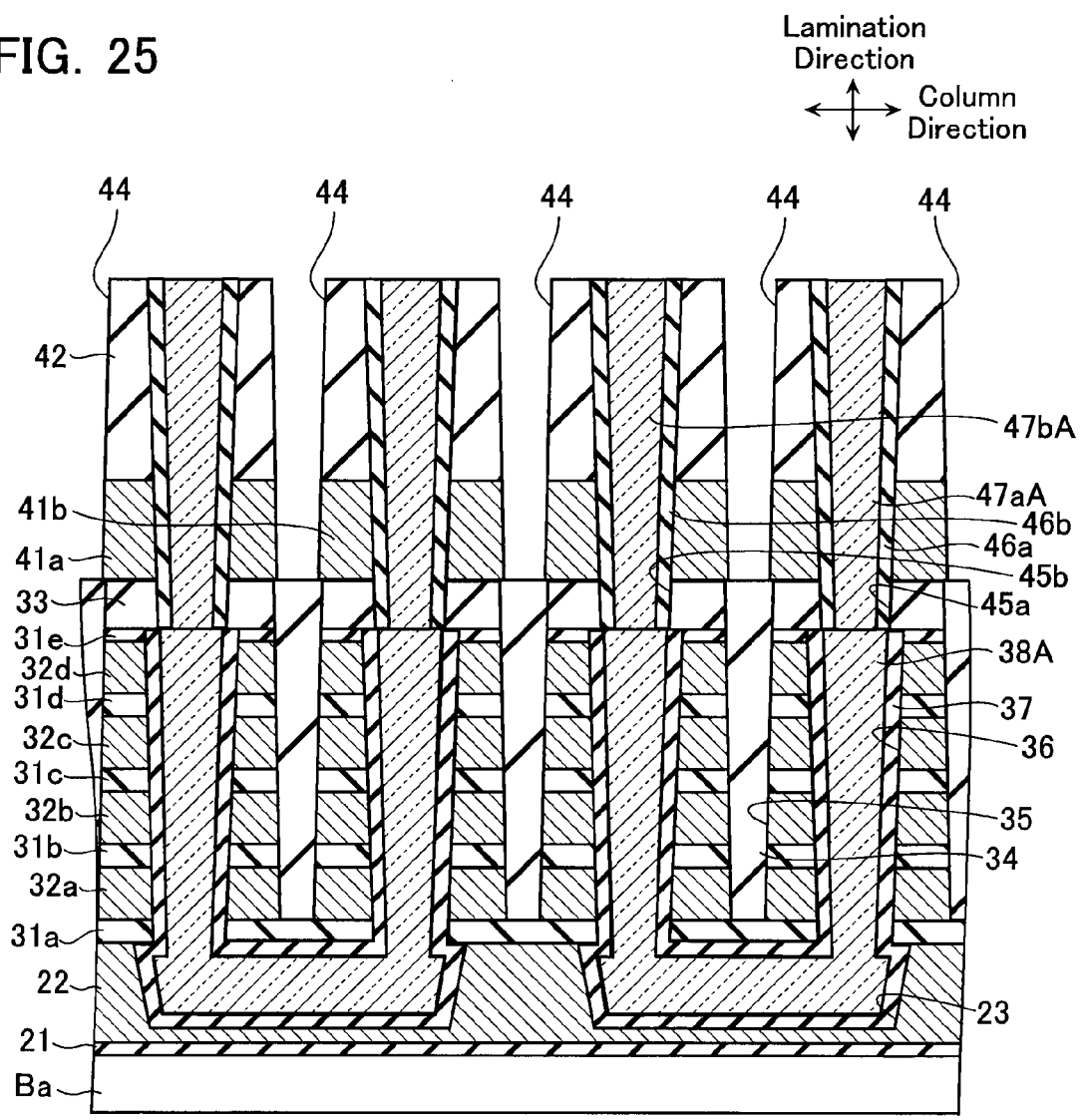
FIG. 25 is a cross-sectional view of the non-volatile semiconductor storage device 100 in the manufacturing process according to the embodiment.

Then, as illustrated in FIG. 25, trenches 44 are formed to penetrate the layer 42A and the layer 41A. The trenches 44 are configured to be arranged at the first pitch 3F in the column direction, and extend to curve in a wave-like fashion in the row direction along the staggered-pattern arrangement of the drain-side holes 45a and the source-side holes 45b. Each trench 44 is formed with a width of F. Through this step, the layer 41A provides drain-side conductive layers 41a and source-side conductive layers 41b. In addition, the layer 42A provides interlayer insulation layers 42.

Figure 26:
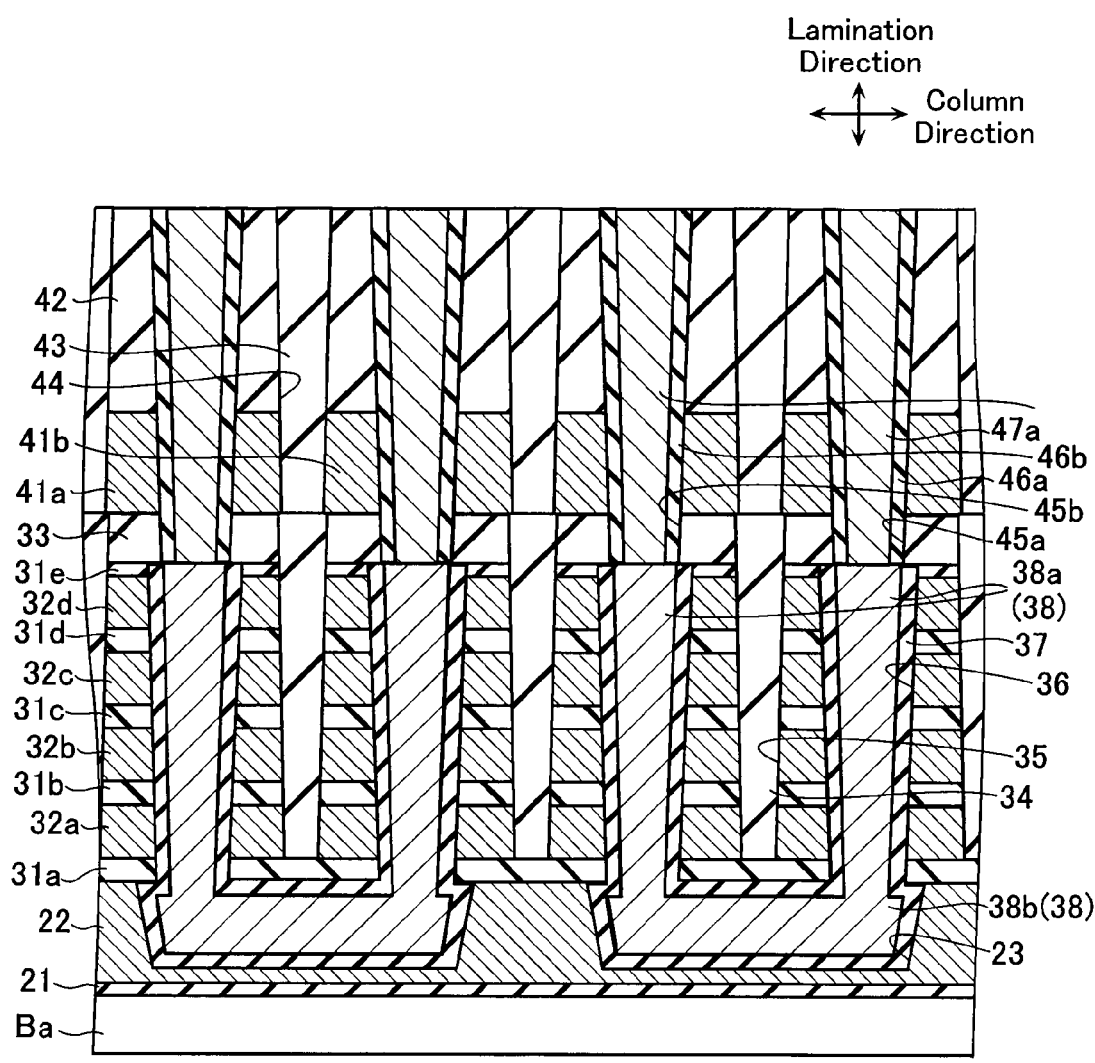
FIG. 26 is a cross-sectional view of the non-volatile semiconductor storage device 100 in the manufacturing process according to the embodiment.

Then, as illustrated in FIG. 26, silicon oxide ($SiO_2$) is deposited to fill up the trenches 44, by which interlayer insulation layers 43 are formed. In addition, heat treatment is performed at 600 degrees C. to crystallize the amorphous silicon layers 38A, 47aA, and 47bA into polysilicon. Through this step, the amorphous silicon layers 38A provide U-shaped semiconductor layers 38. The amorphous silicon layers 47aA provide drain-side columnar semiconductor layers 47a. The amorphous silicon layers 47bA provide source-side columnar semiconductor layers 47b. In addition, after the crystallization, ions are injected into the drain-side columnar semiconductor layers 47a and the source-side columnar semiconductor layers 47b to form diffusion layers. The ion injection is performed under the condition: As, 40 keV, $3 \times 10^{15}$ $cm^{-2}$.

Then, a source-line wiring trench 45c, plug conductive layers 48a, a source conductive layer 48b, and a wiring layer 50 are formed. In this way, the non-volatile semiconductor storage device 100 is formed as illustrated in FIG. 4.

(Advantages of Non-Volatile Semiconductor Storage Device 100 According to this Embodiment)

Advantages of the non-volatile semiconductor storage device 100 according to the embodiment will now be described below, while compared with a comparative example. It is assumed in the comparative example that columnar portions 38a are arranged in a matrix form in the row and column directions, and the first to fourth word-line conductive layers 32a to 32d are formed in a stripe pattern extending in the row direction, and at a certain pitch 3F in the column direction. In this comparative example, the pitch in the column direction at which the columnar portions 38a are positioned is "2F".

In contrast, for the non-volatile semiconductor storage device 100 according to the embodiment, the columnar portions 38a are aligned at the first pitch 3F in the column direction and arranged in a staggered pattern at the second pitch 2F cos θ in the row direction. In addition, the first to fourth word-line conductive layers 32a to 32d are configured to be arranged at the first pitch 3F in the column direction, and extend to curve in a wave-like fashion in the row direction along the staggered-pattern arrangement of the columnar portions 38a.

With this configuration, the non-volatile semiconductor storage device 100 according to the embodiment may reduce the pitch in the column direction at which the columnar portions 38a are positioned by "2F (1−cos θ)" as compared with the comparative example, while maintaining a certain distance (2F) between the columnar portions 38a. That is, the non-volatile semiconductor storage device 100 may reduce its occupation area.

[Other Embodiments]

While embodiments of the non-volatile semiconductor storage device have been described, the present invention is not intended to be limited to the disclosed embodiments, and various other changes, additions, replacements or the like may be made thereto without departing from the spirit of the invention.

In the above-mentioned embodiment, the first side D1 has a length of "2F". The second side D2 has a length of "3F". The third side D3 has a length of "3F". However, the lengths of the first to third sides D1 to D3 are not so limited. Also, the angle θ is not limited to the ones for the triangle T to be an isosceles triangle, but may be any angles that are greater than 0°. While the third side D3 becomes larger than 3F if θ is smaller than 19°, the occupation area may still be reduced as compared with the comparative example.

This means that in the non-volatile semiconductor storage device 100 according to the present invention, the columnar portions 38a need only to be aligned at the first pitch in the column direction and arranged in a staggered pattern at the second pitch in the row direction. In addition, the first to fourth word-line conductive layers 32a to 32d need only to be arranged at the first pitch in the column direction and extend to curve in a wave-like fashion in the row direction along the staggered-pattern arrangement of the columnar portions 38a. Unlike the above-mentioned embodiment, the first pitch is not limited to 3F. Also, the second pitch is not limited to 2F cos θ.

Figure 27:
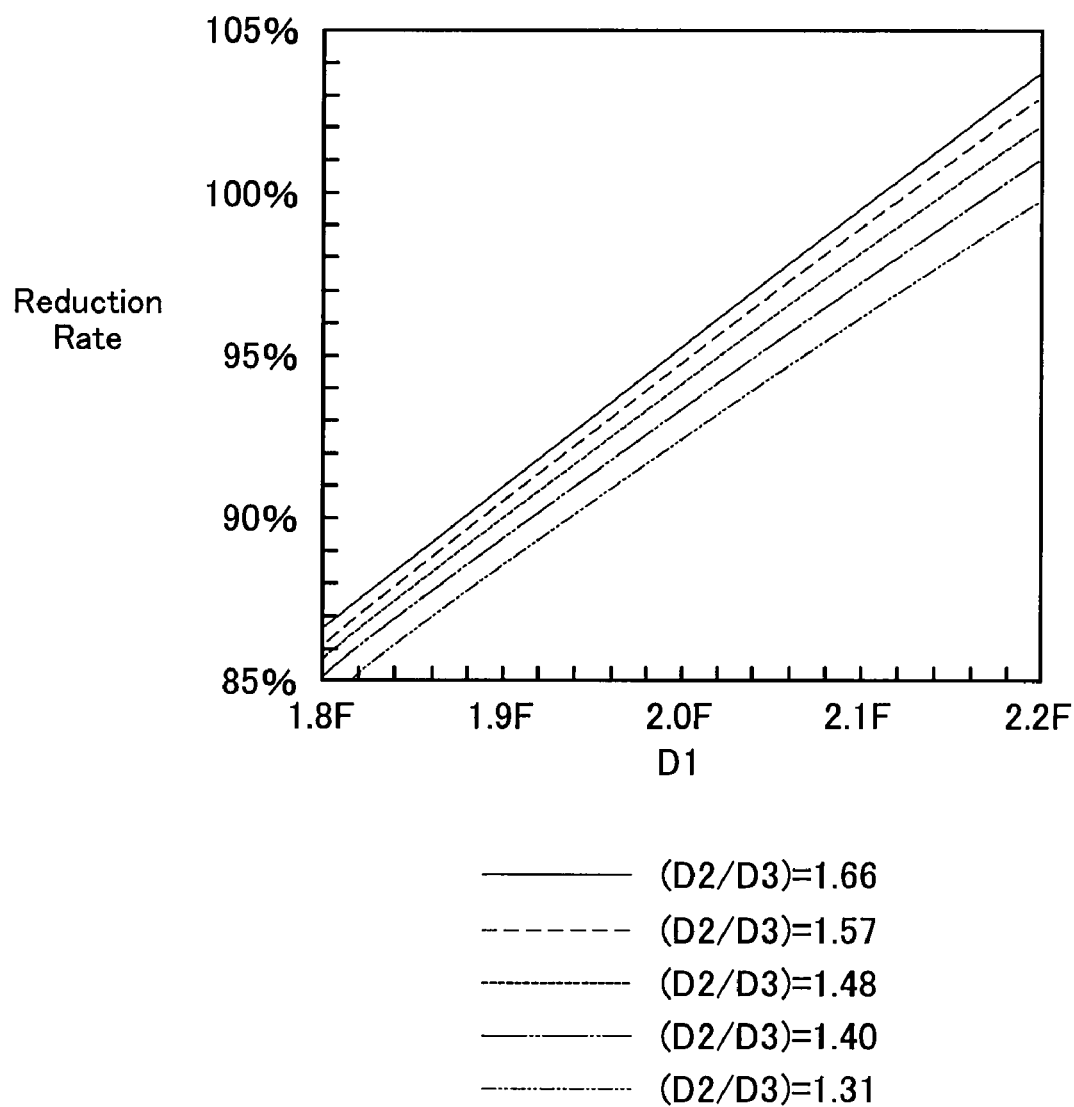
FIG. 27 illustrates the reduction rate corresponding to the lengths of first to third sides D1 to D3 as compared with a comparative example.

Referring now to FIG. 27, the reduction rate achieved by the non-volatile semiconductor storage device according to the present invention is illustrated as compared with the comparative example. As an example, given that (D2/D3)=1.66 (alternatively, 1.57, 1.48, 1.40, or 1.31) and 1.8F≦D1≦2.2F, then the reduction rate compared to the comparative example is as illustrated in FIG. 27.

What is claimed is:

1. A non-volatile semiconductor storage device comprising a plurality of memory strings each having a plurality of electrically rewritable memory cells connected in series,
each of the memory strings comprising:
a first semiconductor layer having a pair of columnar portions extending in a vertical direction to a substrate and a joining portion formed to join lower ends of the pair of columnar portions;
an electric charge accumulation layer formed to surround a side surface of the first semiconductor layer; and
a first conductive layer formed to surround a side surface of the electric charge accumulation layer and functioning as a control electrode of a respective one of the memory cells,
the columnar portions being aligned at a first pitch in a first direction orthogonal to the vertical direction, and being arranged in a staggered pattern at a second pitch in a second direction orthogonal to the vertical and first directions,
the first conductive layers being configured to be arranged at the first pitch in the first direction, and extend to curve in a wave-like fashion in the second direction along the staggered-pattern arrangement.

2. The non-volatile semiconductor storage device according to claim 1, wherein
the columnar portions are arranged in such a way that one of triangles formed by connecting centers of respective three of the columnar portions that has the smallest sum of three sides becomes an isosceles triangle.

3. The non-volatile semiconductor storage device according to claim 1, wherein
the first pitch is 3F, and
the second pitch is less than 2F,
wherein F is the lithography resolution limit.

4. The non-volatile semiconductor storage device according to claim 3, wherein
given that θ represents an acute angle formed by a first line and a second line, the first line having the smallest length among those lines connecting respective two of the columnar portions, the second line extending parallel to the second direction,
the second pitch is 2F cos θ.

5. The non-volatile semiconductor storage device according to claim 3, wherein
the second pitch is substantially 1.89F.

6. The non-volatile semiconductor storage device according to claim 1, comprising a selection transistor connected to one end of a respective one of the memory strings and controlling conduction thereof,
wherein the selection transistor comprises:
a second semiconductor layer extending in the vertical direction from a top surface of each of the columnar portions;
an insulation layer formed to surround a side surface of the second semiconductor layer; and
a second conductive layer formed to surround a side surface of the insulation layer and functioning as a control electrode of the selection transistor.

7. The non-volatile semiconductor storage device according to claim 6, wherein
the second semiconductor layers are aligned at the first pitch in the first direction, and arranged in a staggered pattern at the second pitch in the second direction, and
the second conductive layers are configured to be arranged at the first pitch in the first direction, and extend to curve in a wave-like fashion in the second direction along the staggered-pattern arrangement.

8. The non-volatile semiconductor storage device according to claim 7, wherein the second semiconductor layers are arranged in such a way that one of triangles formed by connecting centers of respective three of the second semiconductor layers that has the smallest sum of three sides becomes an isosceles triangle.

9. The non-volatile semiconductor storage device according to claim 7, wherein
the first pitch is 3F, and
the second pitch is less than 2F,
wherein F is the lithography resolution limit.

10. The non-volatile semiconductor storage device according to claim 9, wherein
given that θ represents an acute angle formed by a first line and a second line, the first line having the smallest length among those lines connecting respective two of the second semiconductor layers, the second line extending parallel to the second direction,
the second pitch is 2F cos θ.

11. The non-volatile semiconductor storage device according to claim 9, wherein
the second pitch is substantially 1.89F.

12. A non-volatile semiconductor storage device comprising a plurality of memory strings each having a plurality of electrically rewritable memory cells connected in series, and a selection transistor connected to one end of a respective one of the memory strings and controlling conduction thereof,
each of the memory strings comprising:
a first semiconductor layer having a pair of columnar portions extending in a vertical direction to a substrate and a joining portion formed to join lower ends of the pair of columnar portions;
an electric charge accumulation layer formed to surround a side surface of the first semiconductor layer; and
a first conductive layer formed to surround a side surface of the electric charge accumulation layer and functioning as a control electrode of a respective one of the memory cells,
the selection transistor comprising:
a second semiconductor layer extending in the vertical direction from a top surface of each of the columnar portions;
an insulation layer formed to surround a side surface of the second semiconductor layer; and
a second conductive layer formed to surround a side surface of the insulation layer and functioning as a control electrode of the selection transistor,
the second semiconductor layers being aligned at a first pitch in a first direction orthogonal to the vertical direction, and being arranged in a staggered pattern at a second pitch in a second direction orthogonal to the vertical and first directions,
the second conductive layers being configured to be arranged at the first pitch in the first direction, and extend to curve in a wave-like fashion in the second direction along the staggered-pattern arrangement.

13. The non-volatile semiconductor storage device according to claim 12, wherein
the second semiconductor layers are arranged in such a way that one of triangles formed by connecting centers of respective three of the second semiconductor layers that has the smallest sum of three sides becomes an isosceles triangle.

14. The non-volatile semiconductor storage device according to claim 12, wherein
the first pitch is 3F, and
the second pitch is less than 2F,
wherein F is the lithography resolution limit.

15. The non-volatile semiconductor storage device according to claim 14, wherein
given that θ represents an acute angle formed by a first line and a second line, the first line having the smallest length among those lines connecting respective two of the second semiconductor layers, the second line extending parallel to the second direction,
the second pitch is 2F cos θ.

16. The non-volatile semiconductor storage device according to claim 14, wherein
the second pitch is substantially 1.89F.

17. A method of manufacturing a non-volatile semiconductor storage device having a plurality of memory strings each having a plurality of electrically rewritable memory cells connected in series, the method comprising:
depositing a plurality of conductive layers sandwiched between insulation layers;
forming a hole to penetrate the plurality of conductive layers and the insulation layers in U-shape, as viewed from a direction parallel to a substrate;
forming an electric charge accumulation layer on a side surface, facing the hole, of each of the plurality of conductive layers;
forming a semiconductor layer to fill up the hole; and
forming a trench to penetrate the plurality of conductive layers and the insulation layers,
the holes being formed to be aligned at a first pitch in a first direction parallel to the substrate, and arranged in a staggered pattern at a second pitch in a second direction parallel to the substrate and orthogonal to the first direction,
the trenches being formed to be positioned at the first pitch in the first direction, and extend to curve in a wave-like fashion in the second direction along the staggered-pattern arrangement.

18. The method of manufacturing the non-volatile semiconductor storage device according to claim 17, wherein
the columnar portions are arranged in such a way that one of triangles formed by connecting centers of respective three of the columnar portions that has the smallest sum of three sides becomes an isosceles triangle.

19. The method of manufacturing the non-volatile semiconductor storage device according to claim 17, wherein
the first pitch is 3F, and
the second pitch is less than 2F,
wherein F is the lithography resolution limit.

20. The method of manufacturing the non-volatile semiconductor storage device according to claim 19, wherein
given that θ represents an acute angle formed by a first line and a second line, the first line having the smallest length among those lines connecting respective two of the columnar portions, the second line extending parallel to the second direction,
the second pitch is 2F cos θ.

* * * * *